United States Patent
Yanase

(10) Patent No.: US 7,589,383 B2
(45) Date of Patent: Sep. 15, 2009

(54) THIN FILM SEMICONDUCTOR DEVICE AND METHOD OF MANUFACTURING THE SAME

(75) Inventor: Jirou Yanase, Tokyo (JP)

(73) Assignee: NEC Corporation, Tokyo (JP)

( * ) Notice: Subject to any disclaimer, the term of this patent is extended or adjusted under 35 U.S.C. 154(b) by 126 days.

(21) Appl. No.: 11/441,213

(22) Filed: May 26, 2006

(65) Prior Publication Data

US 2006/0267895 A1     Nov. 30, 2006

(30) Foreign Application Priority Data

May 27, 2005     (JP)     ............... 2005-154961

(51) Int. Cl.
*H01L 21/8238*     (2006.01)
(52) U.S. Cl. ............... 257/351; 257/E21.639
(58) Field of Classification Search ............ None
See application file for complete search history.

(56) References Cited

U.S. PATENT DOCUMENTS

| | | | | |
|---|---|---|---|---|
| 6,091,115 A | * | 7/2000 | Ohtani et al. | ............... 257/369 |
| 2001/0019158 A1 | * | 9/2001 | Tsujikawa et al. | ............... 257/369 |
| 2002/0098635 A1 | * | 7/2002 | Zhang et al. | ............... 438/199 |
| 2002/0185693 A1 | * | 12/2002 | Yasuda et al. | ............... 257/392 |
| 2003/0077848 A1 | * | 4/2003 | Ma et al. | ............... 438/30 |
| 2004/0195568 A1 | * | 10/2004 | Okumura | ............... 257/59 |

FOREIGN PATENT DOCUMENTS

| | | |
|---|---|---|
| JP | 8-250742 | 9/1996 |
| JP | 2666103 | 6/1997 |
| JP | 10-223909 | 8/1998 |
| JP | 2964232 | 8/1999 |
| JP | 2003-332581 | 11/2003 |
| JP | 2004-128487 | 4/2004 |
| JP | 2004-247413 | 9/2004 |
| JP | 2004-253596 | 9/2004 |

* cited by examiner

*Primary Examiner*—Sue Purvis
*Assistant Examiner*—Benjamin P Sandvik
(74) *Attorney, Agent, or Firm*—Dickstein Shapiro LLP

(57) ABSTRACT

A thin film semiconductor device has: a substrate; a low-voltage thin film transistor formed on the substrate and having a first gate insulating film; and a high-voltage thin film transistor formed on the substrate and having a second gate insulating film whose thickness is larger than that of the first gate insulating film. A threshold voltage of the high-voltage thin film transistor of a first conductivity type is adjusted to be lower than a threshold voltage of the low-voltage thin film transistor of the same first conductivity type when the first gate insulating film and the second gate insulating film are assumed to be identical to each other.

13 Claims, 28 Drawing Sheets

THIN FILM SEMICONDUCTOR DEVICE AND METHOD OF MANUFACTURING THE SAME

BACKGROUND OF THE INVENTION

1. Field of the Invention

The present invention relates to a thin film semiconductor device having a plurality of thin film transistors (abbreviated as "TFTs") formed on an insulating substrate, and a method of manufacturing thereof. More particularly, the present invention relates to a thin film semiconductor device provided with a plurality of kinds of TFTs which are formed on the same substrate and have gate insulating films different in thickness from each other, and a method of manufacturing thereof.

2. Description of the Related Art

An image display device of a flat panel type such as a liquid crystal display device or an organic EL display device has been used as a monitor for a notebook personal computer, a television or the like. The image display device of the flat panel type is characterized by a thinner shape and a lighter weight as compared with a CRT. In such the liquid crystal display device or such the organic EL display device, a display unit having pixels arranged in a matrix form on an insulating substrate such as an inexpensive glass substrate is formed by using a thin film forming technique. Further, a gate driver and a data driver which are semiconductor integrated circuits are externally provided. Signals in accordance with an image are supplied to the pixels through he semiconductor integrated circuits, and thereby an orientation of a liquid crystal molecule or an intensity of light emission of an organic EL is controlled such that the image is displayed.

In recent years, a polysilicon thin film can be formed on a glass substrate as the thin film forming technique has been improved. As a result, a thin film semiconductor device is put to practical use, in which a part of a drive circuit unit including polysilicon TFTs is formed on one and the same substrate together with a pixel unit. An operating voltage of such a drive circuit unit is desired to be lower from the view point of lower electric power consumption. On the other hand, a voltage higher than a predetermined value is required for a pixel operation. It is therefore necessary to form a plurality of kinds of thin film transistors having different operating voltages together on one and the same substrate.

In order to form a plurality of kinds of thin film transistors having different operating voltages together on the same substrate, a technique in which thicknesses of gate insulating films of the thin film transistors are varied in view of withstand voltage of the transistors is commonly used (see, for example, Japanese Patent Publication No. 2666103, Japanese Laid-Open Patent Application JP-P2004-253596A, Japanese Laid-Open Patent Application JP-A-Heisei 8-250742, Japanese Laid-Open Patent Application JP-P2003-332581A, and Japanese Laid-Open Patent Application JP-P2004-247413A). FIG. 1 is a cross-sectional view showing a thin film semiconductor device fabricated by a conventional technique. As shown in FIG. 1, island-like polysilicon films 3 serving as active layers of both of a low-voltage TFT and a high-voltage TFT are formed on an insulating substrate 1. Each of the island-like polysilicon films 3 includes a channel region 3c and source-drain regions. Formed on both sides of the channel region 3c are source-drain regions 3n of an n-channel TFT or source-drain regions 3p of a p-channel TFT. Each of the island-like polysilicon films 3 is covered with a first gate insulating film 4. A gate electrode 5 of the low-voltage n-channel TFT or the low-voltage p-channel TFT is formed on the first gate insulating film 4 over the channel region 3c of the island-like polysilicon film 3. Further, the gate electrode 5 and the first gate insulating film 4 are covered with a second gate insulating film 6. A gate electrode 7 of the high-voltage n-channel TFT or the high-voltage p-channel TFT is formed on the second gate insulating film 6 over the channel region 3c of the island-like polysilicon film 3. Moreover, an interlayer insulating film 8 is formed over all of the TFTs, and contact holes are formed to penetrate through the interlayer insulating film 8, the second gate insulating film 6 and the first gate insulating film 4. Formed via the contact holes are electrodes 9 being in contact with the source-drain regions 3n of the n-channel TFT and the source-drain regions 3p of the p-channel TFT.

According to the conventional technique, the source-drain regions 3n and 3p are formed without using any self-alignment method, or only the low-voltage TFTs are formed by using the self-alignment method while the high-voltage TFTs are formed without using any self-alignment method. Moreover, the channel region 3c of the TFT is a non-doped or a B-doped region, and the channel region 3c of the high-voltage TFT and the channel region 3c of the low-voltage TFT are formed to be the same doping state. Furthermore, Al or Cr or Si is used as the material of the gate electrodes 5 and 7, and the gate electrode 7 of the high-voltage TFT and the gate electrode 5 of the low-voltage TFT are made of the same material.

As for channel doping, a high-voltage transistor and a low-voltage transistor may be different from each other in a bulk type MOS transistor (see, for example, Japanese Patent Publication No. 2964232 and Japanese Laid-Open Patent Application JP-P2004-128487A). According to the Japanese Patent Publication No. 2964232, a channel region of a high-voltage n-channel MOS transistor is doped with an n-type dopant and a p-type dopant, while a channel region of a low-voltage n-channel MOS transistor is doped with only a p-type dopant. A channel region of a high-voltage p-channel MOS transistor is doped with an n-type dopant at a low density, while a channel region of a low-voltage p-channel MOS transistor is doped with an n-type dopant at a high density. Furthermore, the Japanese Patent Publication No. 2964232 also discloses another example, in which a channel region of a high-voltage n-channel MOS transistor is doped with a p-type dopant at a low density, while a channel region of a low-voltage n-channel MOS transistor is doped with a p-type dopant at a high density, and a channel region of a high-voltage p-channel MOS transistor is doped with an n-type dopant and a p-type dopant, while a channel region of a low-voltage p-channel MOS transistor is doped with only an n-type dopant.

Japanese Laid-Open Patent Application JP-A-Heisei 10-223909 discloses a semiconductor device, in which a conductive film having a work function different from that of material of a gate electrode is formed, and thereby a threshold voltage of a transistor is controlled.

FIG. 2 shows characteristics of the high-voltage TFTs and the low-voltage TFTs manufactured through the conventional method disclosed in the above-mentioned patent document: Japanese Patent Publication No. 2666103 and Japanese Laid-Open Patent Application JP-P2004-253596A. As shown in FIG. 2, there is a problem in that threshold voltages (Vth) of the high-voltage n-channel TFT and the high-voltage p-channel TFT are higher than those of the low-voltage n-channel TFT and the low-voltage n-channel TFT, respectively. Here, the threshold voltage (Vth) is a gate voltage with which a sufficient current begins to flow between the drain and the source of the transistor. It should be noted in the present specification that the low and high threshold voltages do not mean small and large absolute values, respectively. Unless not specially noted, a value on the more positive side is referred to "a higher voltage (or a larger voltage)" and a value on the more negative side is referred to "a lower voltage (or a smaller voltage)" in the specification of the present application. Here, the above-mentioned problem cannot be solved even when the manufacturing method described in the Japanese Patent Publication No. 2666103 is adopted, because a difference in the threshold voltage between the low-voltage p-channel TFT and the high-voltage p-channel TFT is undesirably increased.

For example, a peripheral drive circuit of a liquid crystal display device consists of digital circuits which manage two voltages at low level and high level. It is therefore desirable that a TFT is turned off at the time when the gate voltage is 0 V and also a sufficient drive current is obtained with a gate voltage of a small absolute value. In other words, it is desirable that the threshold voltage should not be so close to 0 V and should not be much away from 0 V. The reason is that an electric power consumption by the circuit during standby time increases in a case where the absolute value of the threshold voltage is extremely small, while a sufficient current driving ability cannot be achieved with a predetermined gate voltage in a case where the absolute value of the threshold voltage is large, which causes a deficient operation due to signal delay. According to the conventional characteristics shown in FIG. 2, a leak current in the high-voltage p-channel TFT at the time of the O-level signal may become large since the threshold voltage is 0 V, while the driving current of the high-voltage n-channel TFT may become insufficient since the threshold voltage is as high as 6 V.

The reason why the threshold voltage of the high-voltage TFT becomes high (i.e., shifts to the positive side) is that a carrier is captured by a recombination center which is generated in a forbidden band due to contamination in the gate insulating film of the high-voltage TFT and crystal defect in the channel region of the high-voltage TFT. More specifically, the contamination is caused by residual of the gate etching for the gate electrode of the low-voltage TFT. Also, the gate insulating film is damaged by plasma in a case of over-etching in the dry etching process for the gate electrode of the low-voltage TFT. Moreover, the crystal defect is generated at a surface of the polysilicon other than a region covered by the gate electrode of the low-voltage TFT, because of irradiation with a laser beam or a lamp beam at the process for activating impurities implanted into the source-drain regions. As described above, the problem that the threshold voltages of the high-voltage TFTs of both channel types become higher than those of the low-voltage TFTs is peculiar to the thin film semiconductor device shown in FIG. 1, in which the island-like polysilicon films 3 are formed on the insulating substrate and further the first gate insulating film, the gate electrode of the low-voltage TFT, the second gate insulating film and the gate electrode of the high-voltage TFT are formed in order on the island-like polysilicon films 3.

SUMMARY OF THE INVENTION

The present invention has been accomplished to solve the above-described problem experienced in the conventional technique. An object of the present invention is to provide a thin film semiconductor device provided with a plurality of TFTs respective of which have different gate insulating film thicknesses and have appropriate threshold voltages. Another object of the present invention is to provide such a thin film semiconductor device without markedly increasing the number of manufacturing processes.

In an aspect of the present invention, a thin film semiconductor device is provided. The thin film semiconductor device has a substrate, a low-voltage thin film transistor formed on the substrate, and a high-voltage thin film transistor formed on the substrate. The low-voltage thin film transistor has a first gate insulating film and a first gate electrode formed on the first gate insulating film. The high-voltage thin film transistor has a second gate insulating film and a second gate electrode formed on the second gate insulating film. Thickness of the second gate insulating film is larger than that of the first gate insulating film.

According to the present invention, a threshold voltage of the high-voltage thin film transistor of a first conductivity type is adjusted to be lower than a threshold voltage of the low-voltage thin film transistor of the first conductivity type, when the first gate insulating film and the second gate insulating film are assumed to be identical to each other, i.e., under a condition that thickness, material and charge density of the first gate insulating film are the same as those of the second gate insulating film, respectively.

Here, it is defined that p-type dopant concentration is represented by positive values, while n-type dopant concentration is represented by negative values. In this case, an impurity doping state with respect to a channel region of the high-voltage thin film transistor is adjusted to be in more negative side as compared with an impurity doping state with respect to a channel region of the low-voltage thin film transistor. For example, the p-type dopant concentration in the channel region of the high-voltage thin film transistor is lower than the p-type dopant concentration in the channel region of the low-voltage thin film transistor. The n-type dopant concentration in the channel region of the high-voltage thin film transistor is higher than the n-type dopant concentration in the channel region of the low-voltage thin film transistor.

A work function of material of the second gate electrode may be set lower than a work function of material of the first gate electrode.

In another aspect of the present invention, a method of manufacturing a thin film semiconductor device is provided. The method includes: (A) forming semiconductor thin films on a substrate; (B) forming a first gate insulating film on the semiconductor thin films; (C) forming a first gate electrode of a low-voltage thin film transistor on the first gate insulating film; (D) forming source-drain regions of the low-voltage thin film transistor; (E) forming a second gate insulating film to cover the first gate electrode and the first gate insulating film; and (F) forming a second gate electrode of a high-voltage thin film transistor on a stacked film of the first and the second gate insulating films.

The method further includes (X) implanting n-type dopant in the semiconductor thin film in regions where the low-voltage thin film transistor and the high-voltage thin film transistor are to be formed. The method may further include (Y) implanting p-type dopant in the semiconductor thin film in the region where the low-voltage thin film transistor is to be formed. The method may further include (Z) implanting n-type dopant in the semiconductor thin film in the region where the high-voltage thin film transistor is to be formed. The (X) process may be carried out between the (C) process and the (F) process. The (Y) and (Z) processes may be carried out between the (A) process and the (C) process.

Alternatively, a work function of material of the second gate electrode formed in the (F) process may be set lower than a work function of material of the first gate electrode formed in the (C) process.

The above-mentioned problem according to the conventional technique that the threshold voltage of the high-voltage TFT becomes higher than that of the low-voltage TFT in both cases of n-channel type and p-channel type is first found out by the inventors. In order to solve the problem, the threshold voltage of the high-voltage TFT of the first conductivity type is adjusted to be lower than that of the low-voltage TFT of the same first conductivity type under a condition that the second gate insulating film of the high-voltage TFT is identical to the first gate insulating film of the low-voltage TFT. That is to say, the threshold voltage of the high-voltage TFT is controlled to shift toward the negative side. Some methods can be considered for shifting the threshold voltage. In practice, two methods can be considered: (1) controlling the doping with respect to the channel region; and (2) appropriately selecting the material of the gate electrode. The reason why the threshold voltage can be adjusted by adopting such methods will be described below.

First, description will be given on the former method in which the threshold voltage is controlled by injecting ions into the channel region. The threshold voltage Vth of an TFT is approximated by the following equation (1).

$$Vth = \Phi_m - \Phi_s \pm 2\phi_b \pm (4E_o E_{sq} N \phi_b)^{1/2}/C_{ox} \pm qn\alpha/C_{ox} \quad (1)$$

Here, $\Phi_m$ is a work function of a gate electrode, $\Phi_s$ is a work function of an active layer (channel region), $\phi_b = kT/q \ln(N/Ni)$, $N = n\alpha/t_s$, q is the elementary electric charge, $C_{ox} = E_o E_{ox}/t_{ox}$, $t_s$ is thickness of a semiconductor thin film, $t_{ox}$ is thickness of a gate insulating film, $E_o$ is the electrical constant, $E_s$ is relative permittivity of silicon, $E_{ox}$ is relative permittivity of $SiO_2$, n is channel dose (concentration per unit area), α is activation rate of dopant, and Ni is impurity concentration in intrinsic Si. In the above equation (1), the double sign ± is positive in a case where the channel dose impurity is an acceptor, while is negative in a case where it is a donor.

FIGS. 3A and 3B are graphs illustrating relationships between variation of the threshold voltage (ΔVth) and impurity dose (n) with respect to the channel region, which are obtained based on the above equation (1). In a case of the acceptor (e.g. B), as shown in FIG. 3A, the threshold voltage is adjusted toward the positive side as the acceptor dose increases. This is mainly because of contribution of the fifth term $+qn\alpha/C_{ox}$ in the above equation (1). Since the acceptor is ionized negatively, positive charge of +qnα occurs in the channel region. As a result, negative charge of −qnα is induced on the gate electrode side through the gate insulating film capacitance $C_{ox}$. It is thus necessary to apply the voltage $+qn\alpha/C_{ox}$ to the gate electrode in order to negate the negative charge. On the other hand, in a case of the donor (e.g. P), as shown in FIG. 3B, the threshold voltage is adjusted toward the negative side as the donor dose increases. In contrast to the case of the acceptor, negative charge of −qnα occurs in the channel region, since the donor is ionized positively. As a result, positive charge of +qnα is induced on the gate electrode side through the gate insulating film capacitance $C_{ox}$. It is thus necessary to apply the voltage $-qn\alpha/C_{ox}$ to the gate electrode in order to negate the positive charge. Furthermore, it can be also seen from FIGS. 3A and 3B that the variation of threshold voltage with regard to a certain dose becomes larger as the thickness of the gate insulating film ($t_{ox}$) becomes larger. In a case where the thickness of the gate insulating film is 150 nm, for example, the donor (P) dose of $6.0 \times 10^{11}$ cm$^{-2}$ is necessary for adjusting the threshold voltage by −3 V.

Next, description will be given on the latter method in which the threshold voltage of the high-voltage TFT is lowered by selecting the material of the gate electrode. In this case, work function of the gate electrode of the high-voltage TFT is designed to be lower than work function of the gate electrode of the low-voltage TFT. FIGS. 4A, 4B, 5A, 5B, 6A and 6B are energy band diagrams of a MOS structure. FIGS. 4A, 5A and 6A illustrates a case where Al (work function $\Phi_m$=4.1 eV) is used as the material of the gate electrode having relatively low work function, while FIGS. 4B, 5B and 6B illustrates a case where Cr (work function $\Phi_m$=4.6 eV) is used as the material of the gate electrode having relatively high work function. FIGS. 4A and 4B show the energy band corresponding to a state (junction state) in which no gate voltage is applied. FIGS. 5A and 5B show the energy band corresponding to a flat-band state. FIGS. 6A and 6B show the energy band corresponding to a state in which the threshold voltage is applied. In an n-channel transistor whose channel region is made of p-type silicon (work function $\Phi_s$=4.9 eV), the Fermi level (Ef) of the channel region and the Fermi level (Ef) of the gate electrode are coincident with each other when the gate voltage is not applied to the gate electrode. Thus, when the work function $\Phi_m$ of the gate electrode is lower than the work function $\Phi_s$ of the channel region ($\Phi_m<\Phi_s$), the energy band of the channel region (Si) bends downward in accordance with the difference in the work functions between the gate electrode and the channel region (active layer), as shown in FIGS. 4A and 4B. Moreover, a weak inversion layer is formed near a surface of the channel region. Here, as the difference in the work functions between the gate electrode and the active layer becomes larger, namely, as the work function of the gate electrode becomes smaller, the bending of the energy band becomes more conspicuous and the electron density near the surface of the channel region increases.

In order to drive electrons toward semiconductor side from the status shown in FIGS. 4A and 4B in which the inversion layer is formed by minority carriers (electrons), it is necessary to set the energy band of the channel region to a flat state. As shown in FIGS. 5A and 5B, the negative voltage applied to the gate electrode at this time is in accordance with the difference in the work functions. That is, the gate voltage necessary at this time is the flat-band voltage Vfb ($=\Phi_m-\Phi_s$). FIGS. 6A and 6B corresponds to the state in which the threshold voltage is applied and a strong inversion layer appears. As can be seen from FIGS. 4A, 4B, 6A and 6B, the larger the work function of the gate electrode, the flat-band voltage Vfb and the threshold voltage Vth become higher (shifts toward more positive side).

FIGS. 4A, 4B, 5A, 5B, 6A and 6B illustrate the case of n-channel type. The same applies to the case of p-channel type. Also in the case of p-channel type, the larger the work function of the gate electrode, the flat-band voltage Vfb and the threshold voltage Vth become higher (shifts toward more positive side).

FIG. 7 is a graph illustrating a quantitative relationship between the variation of threshold voltage (ΔVth) and the work function of gate electrode material ($\Phi_m$). In FIG. 7, threshold voltage of n$^+$-type Si is used as a reference value, and the variation as compared with the reference value is represented as ΔVth. It can be seen from FIG. 7, the variation ΔVth becomes larger in the positive direction, as the work function $\Phi_m$ of the gate electrode becomes larger. It is thus possible to control the threshold voltage by selecting the material of the gate electrode.

According to the present invention, the threshold voltage of the high-voltage TFT is controlled by adjusting the channel doping or selecting the material of the gate electrode to be lower than the threshold voltage of the low-voltage TFT under the condition that the gate insulating films of the respective TFTs are assumed to be the same. That is to say, the threshold voltage of the high-voltage p-channel TFT, which has been conventionally set to nearly 0 V, can be set to a lower value, namely, a value more away from 0 V. Moreover, the threshold voltage of the high-voltage n-channel TFT, which has been conventionally set to too high value, can be set to a lower value, namely, a value more close to 0 V. It is thus possible to solve the above-mentioned problem in the conventional thin film semiconductor device that the threshold voltages of the high-voltage TFTs of the p-channel and n-channel types have been set higher than the threshold voltages of the low-voltage TFTs of the p-channel and n-channel types, respectively. It is thus possible to solve the above-mentioned problem that the threshold voltage of the high-voltage TFT becomes so close to 0 V or becomes much away from 0 V. As described above, it is possible according to the present invention to prevent the increase in the current consumption during the standby state and to suppress the signal delay caused by the shortage of the driving current.

Furthermore, the method of manufacturing the thin film semiconductor device according to the present invention can be implemented by only adding such a process as adjusting the channel doping or selecting the material of the gate electrode to the commonly-used processes. Therefore, according to the present invention, the structure which includes the low-voltage TFT and the high-voltage TFT having the desired threshold voltages can be achieved without inducing any marked increase in the cost of manufacturing.

DESCRIPTION OF THE PREFERRED EMBODIMENTS

Embodiments of the present invention will be described below in detail with reference to the attached drawings.

First Embodiment

Figure 8:
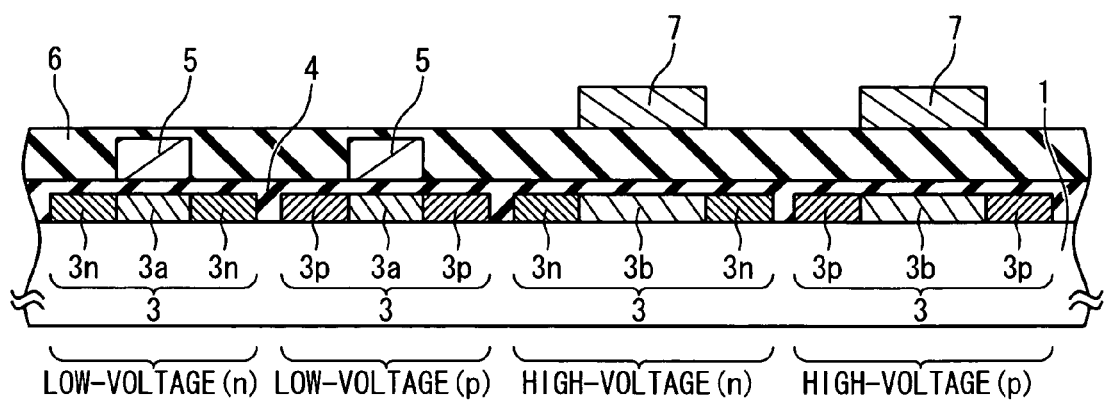
FIG. 8 is a cross-sectional view showing a thin film semiconductor device according to a first embodiment of the present invention.

FIG. 8 is a cross-sectional view showing a thin film semiconductor device according to a first embodiment of the present invention. As shown in FIG. 8, low-voltage TFTs and high-voltage TFTs of both channel types are formed on an insulating substrate 1 in the thin film semiconductor device according to the present embodiment. More specifically, island-like polysilicon films 3 which serve as active regions of the respective transistors are independently formed on the insulating substrate 1. Gate electrodes 5 of the low-voltage TFTs are formed on some of the island-like polysilicon films 3 through a first gate insulating film 4. Moreover, gate electrodes 7 of the high-voltage TFTs are formed on the other of the island-like polysilicon films 3 through the first gate insulating film 4 and a second gate insulating film 6.

In the island-like polysilicon films 3 for both of the low-voltage n-channel TFT and the high-voltage n-channel TFT, source-drain regions $3n$ into which n-type impurity is doped at a high density are formed. On the other hand, in the island-like polysilicon films 3 for both of the low-voltage p-channel TFT and the high-voltage p-channel TFT, source-drain regions $3p$ into which p-type impurity is doped at a high density are formed. A channel region $3a$ sandwiched between the source-drain regions of the low-voltage TFT is an "acceptor intensified region $3a$" which can contain relatively many acceptors. On the other hand, a channel region $3b$ sandwiched between the source-drain regions of the high-voltage TFT is a "donor intensified region $3b$" which can contain relatively many donors.

Figure 9:
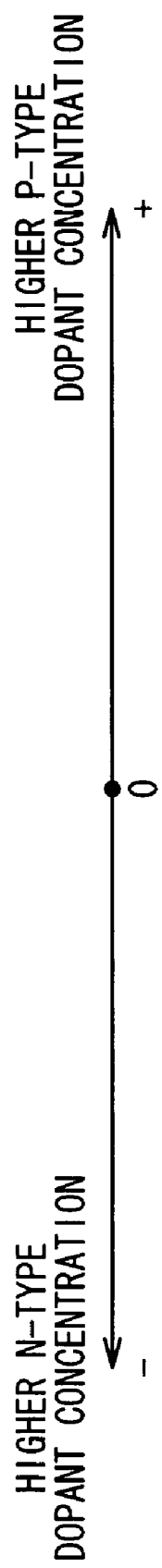
FIG. 9 is a diagram illustrating a dopant concentration.

Here, the acceptor intensified region $3a$ and the donor intensified region $3b$ should be understood in a relative manner, which will be explained below with reference to FIG. 9. FIG. 9 illustrates a coordinate axis, in which a non-doped state is represented by 0, concentration of n-type dopant is scaled with negative values, and concentration of p-type dopant is scaled with positive values. An impurity doping state of a certain region can be represented by one point on the coordinate axis. With regard to a region doped with both of the n-type dopant and the p-type dopant, its doping state is represented by a point obtained by subtracting the n-type dopant concentration from the p-type dopant concentration. On the present coordinate axis, the impurity doping state of the acceptor intensified region 3a is located rightward, namely, in more positive side as compared with that of the donor intensified region 3b. The impurity doping state of the donor intensified region 3b is located leftward, namely, in more negative side as compared with that of the acceptor intensified region 3a. The regions 3a and 3b can contain therein either one or both of the acceptor and the donor as long as they are separate from each other on the coordinate axis shown in FIG. 9.

The doping states of the channel regions in the low-voltage n-channel TFT and the low-voltage p-channel TFT are not necessarily coincident with each other. Similarly, the doping states of the channel regions in the high-voltage n-channel TFT and the high-voltage p-channel TFT are not necessarily coincident with each other. The point is that the doping state of the channel region in the high-voltage n-channel TFT is located leftward on the coordinate axis shown in FIG. 9 as compared with that of the channel region in the low-voltage n-channel TFT, and that the doping state of the channel region in the high-voltage p-channel TFT is located leftward on the coordinate axis as compared with that of the channel region in the low-voltage p-channel TFT.

Figure 10:
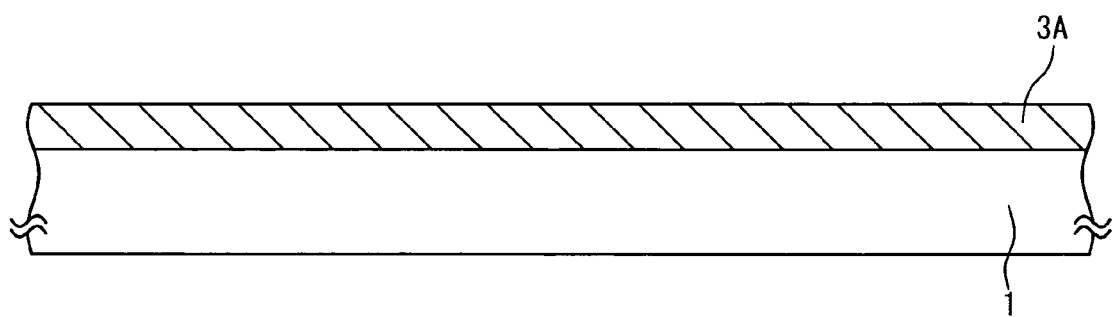
FIG. 10 is a cross-sectional view showing a process of forming an amorphous silicon film.
Figure 11A:
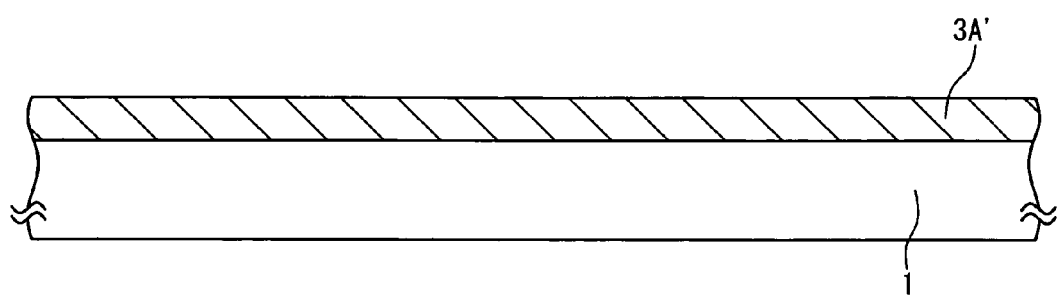
FIGS. 11A and 11B are cross-sectional views showing another process of forming an amorphous silicon film.
Figure 11B:
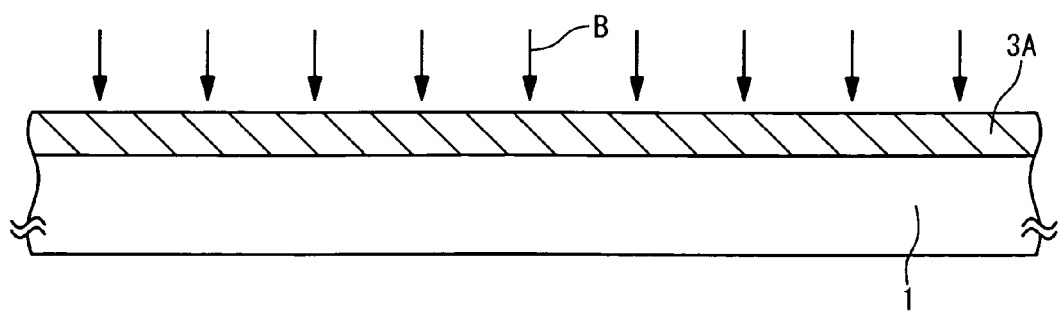

A polysilicon film used for forming the island-like polysilicon film 3 may be formed directly on the insulating substrate 1. However, in order to form a polysilicon film of high quality on a substrate of poor heat-resistance, it is preferable that an amorphous silicon film is first formed on the insulating substrate 1 and then the amorphous silicon film is annealed to be a polysilicon film. A doped amorphous silicon film can be formed in the following manners. For example, an amorphous silicon film is formed while an impurity (e.g. B) is doped therein. As a result, an amorphous silicon film 3A of p-conductivity type can be formed directly on the insulating substrate 1, as shown in FIG. 10. Alternatively, a non-doped amorphous silicon film 3A' may be first formed on the insulating substrate 1 as shown in FIG. 11A, and thereafter the film 3A' is doped with an impurity (e.g. B) to be an amorphous silicon film 3A of p-conductivity type as shown in FIG. 11B. As for the poly-crystallization of the amorphous silicon film 3A, a method heretofore known can be used. In particular, a laser annealing method is preferably used.

In forming the source-drain regions, a self-alignment method can be adopted with respect to both of the low-voltage TFT and the high-voltage TFT. Alternatively, the self-alignment method may be adopted with respect to only the low-voltage TFT. In the latter case, it is preferable that the source-drain regions 3n of the high-voltage n-channel TFT is formed by using a resist mask at the same time when the source-drain regions 3n of the low-voltage n-channel TFT is formed. Also, it is desirable that the source-drain regions 3p of the high-voltage p-channel TFT is formed by using a resist mask at the same time when the source-drain regions 3p of the low-voltage p-channel TFT is formed. In the case where the source-drain regions in both of the low-voltage TFT and the high-voltage TFT are formed through the self-alignment method, the gate electrode 5 is formed, and after that, the source-drain regions of the low-voltage TFT are formed by using the gate electrode 5 as a mask. Also, the gate electrode 7 is formed, and after that, the source-drain regions of the high-voltage TFT are formed by using the gate electrode 7 as the mask. Alternatively, the gate electrode 5 and the gate electrode 7 are formed, and then, the source-drain regions of both of the low-voltage TFT and the high-voltage TFT may be formed at the same time by using both the gate electrodes 5 and 7 as masks. In a case where the source-drain regions in both of the low-voltage TFT and the high-voltage TFT are formed without using the self-alignment method, the source-drain regions 3n of the low-voltage and the high-voltage TFTs and the source-drain regions 3p of the low-voltage and the high-voltage TFTs are formed by using resist masks before or after the formation of the first gate insulating film 4.

After the impurity doping for forming the source-drain regions, the implanted impurity is activated. With regard to the impurity activation, it is preferable to adopt a light irradiation method using a laser beam or a lamp beam. Alternatively, in order to protect the gate electrode of the TFT from a heat treatment at a high temperature, a heat activation method by using an electric furnace, a short-time heat activation method by spraying high-temperature nitrogen and the like may be selected depending on a material for use in the gate electrode of the low-voltage TFT. If the gate electrode is exposed during the activation process, the gate electrode should be desirably covered with a gate cover film made of SiO2, followed by the activation process.

Examples of the impurity doping with respect to the channel region include a doping with respect to the entire polysilicon film and a selective doping with respect to the channel region of any of the high-voltage TFT and the low-voltage TFT. In the case of the doping with respect to the entire polysilicon film, the doping can be carried out during the film formation. If the doping is carried out after the film formation, the doping can be carried out by ion injection or the like at an appropriate timing after the silicon film is formed and before the gate electrode material is formed. In a case where the channel region of either one of the high-voltage TFT and the low-voltage TFT is not doped with any impurity, the doping with respect to the entire polysilicon film is omitted.

In the case where the island-like polysilicon film 3 for the low-voltage TFT is selectively doped with an impurity (i.e., an acceptor in this case), the ion doping is carried out by ion injection and the like under a condition that the island-like polysilicon film 3 for the high-voltage TFT is covered with a resist mask, at an appropriate timing after the silicon film is formed and before the material of the gate electrode 5 is formed. In contrast, in the case where the island-like polysilicon film 3 for the high-voltage TFT is selectively doped with an impurity (i.e., a donor in this case), the ion doping is carried out by ion injection and the like at an appropriate timing after the silicon film is formed and before the material of the gate electrode 7 is formed. If the impurity doping is carried out before the formation of the gate electrode 5, the impurity is doped under a condition that the island-like polysilicon film 3 for the low-voltage TFT is covered with a resist mask. If the impurity doping is carried out after the formation of the gate electrode 5, the impurity can be doped by using the gate electrode 5 as a mask, in other words, without any resist mask.

FIRST EXAMPLE

FIGS. 12A to 12I are cross-sectional views showing a first example of processes of manufacturing the thin film semiconductor device according to the first embodiment of the present invention.

Figure 1:
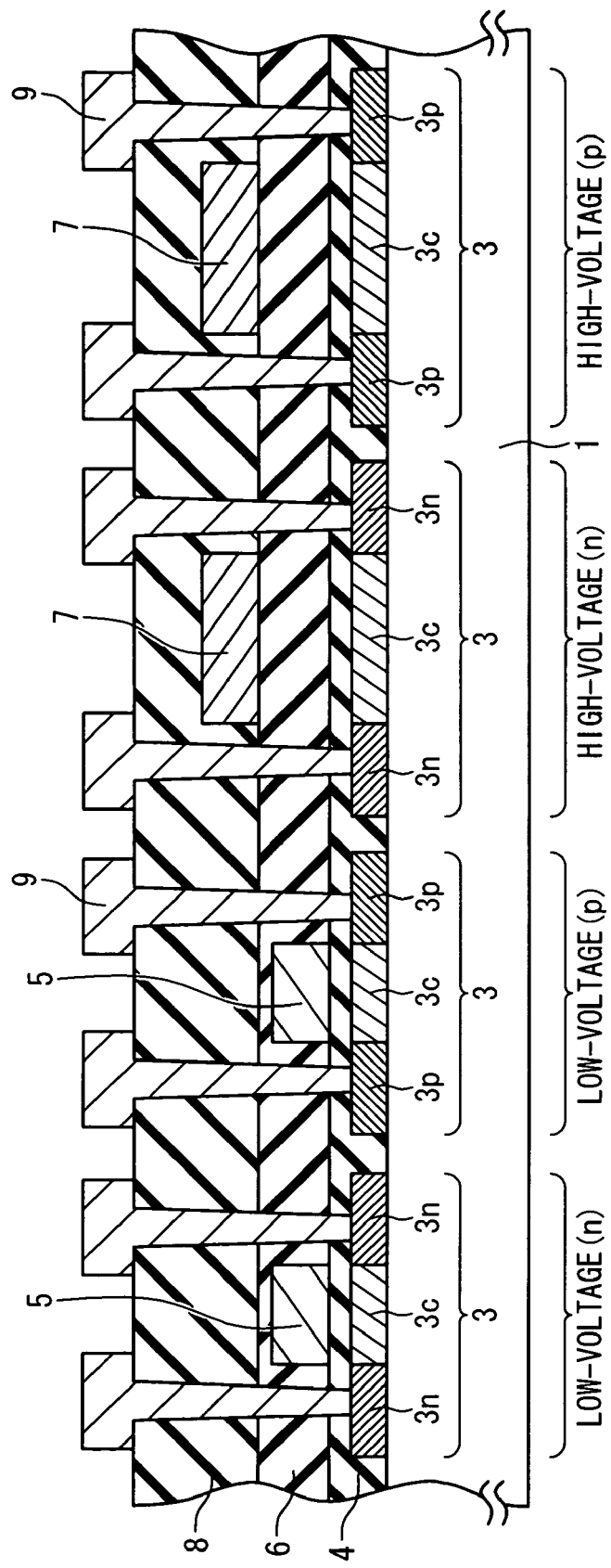
FIG. 1 is a cross-sectional view showing a thin film semiconductor device according to a conventional technique.
Figure 2:
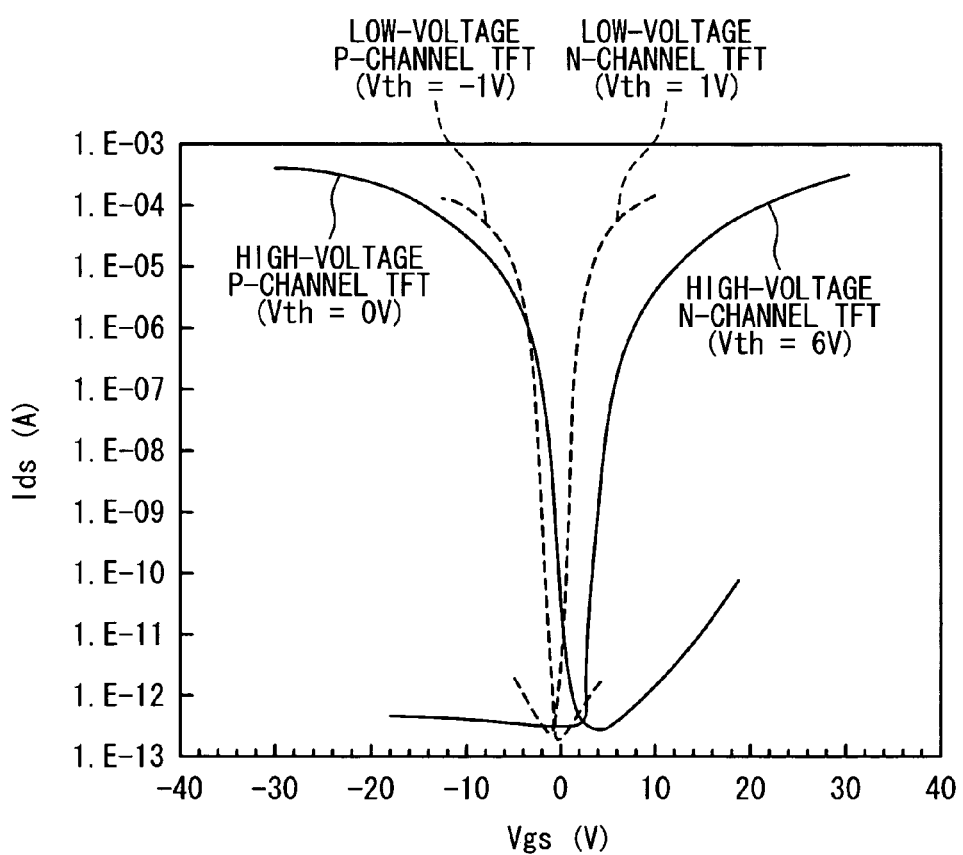
FIG. 2 is a graph illustrating Id-Vg characteristics according to the conventional technique.
Figure 3A:
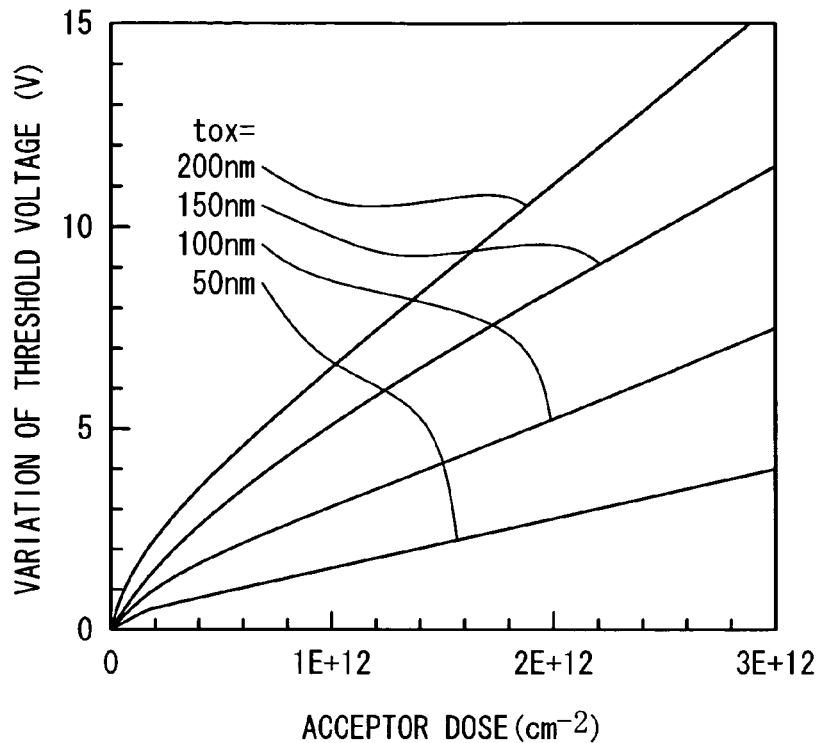
FIGS. 3A and 3B are graphs illustrating relationships between variation of threshold voltage and ion injection quantity to an active layer, which are obtained based on a mathematical equation.
Figure 3B:
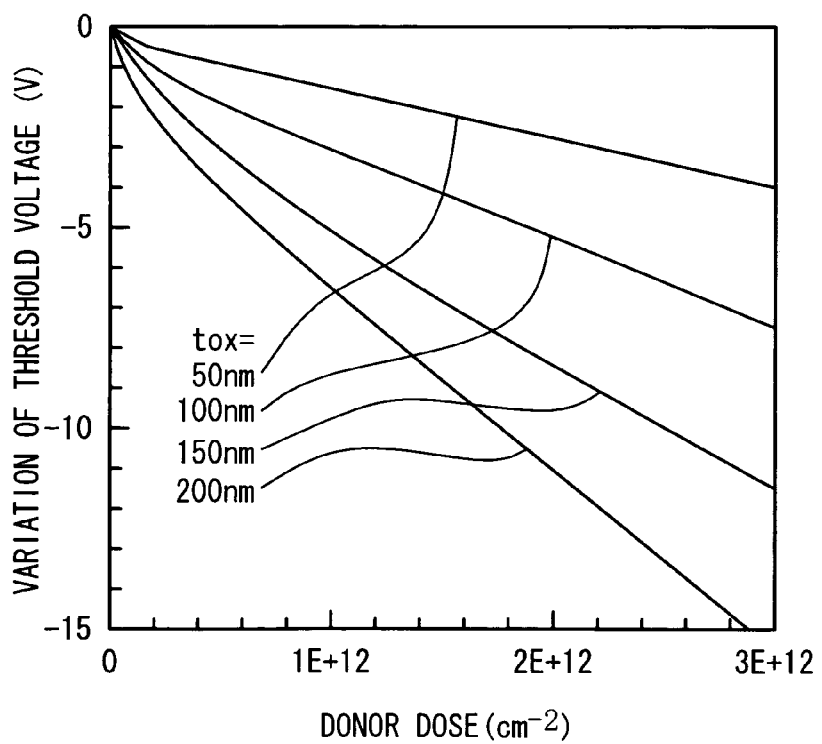
Figure 4A:
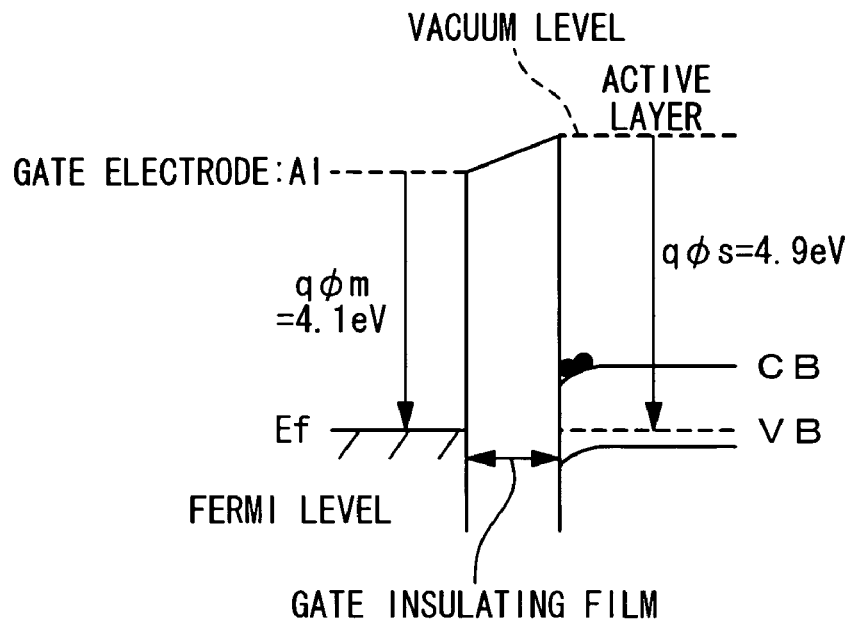
FIGS. 4A and 4B are diagrams illustrating energy bands of a MOS structure in a first state.
Figure 4B:
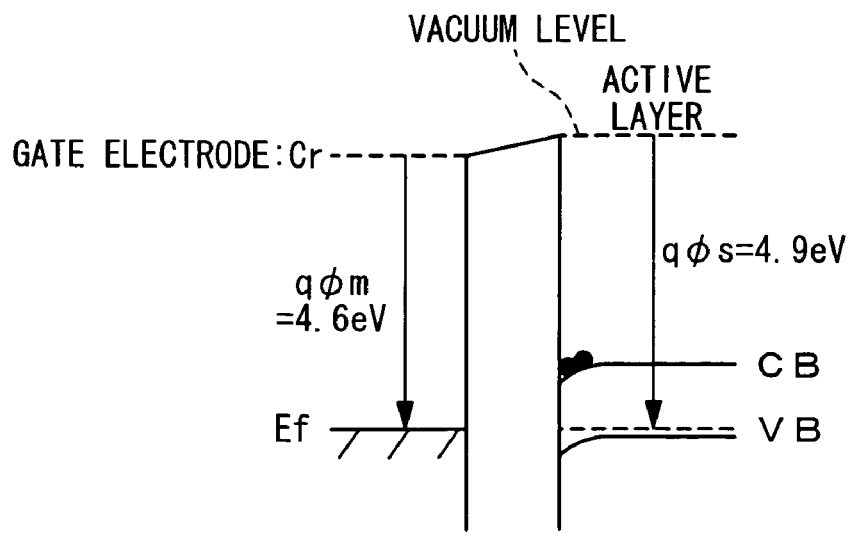
Figure 5A:
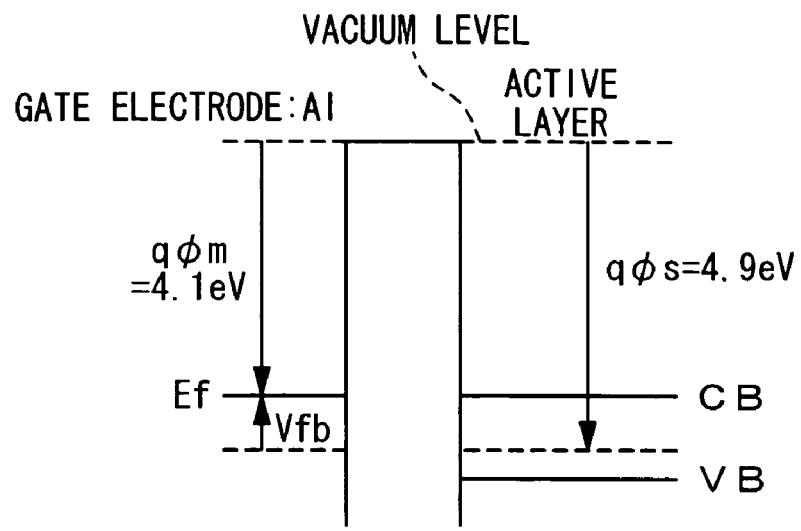
FIGS. 5A and 5B are diagrams illustrating energy bands of the MOS structure in a second state.
Figure 5B:
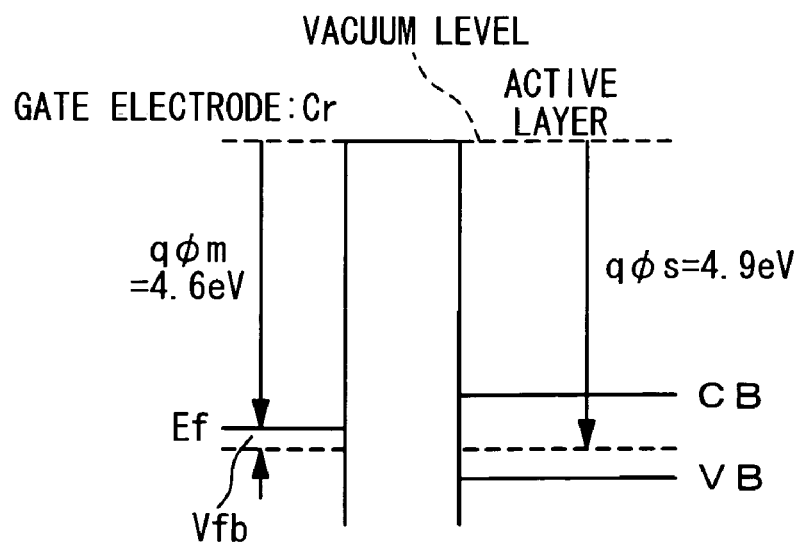
Figure 6A:
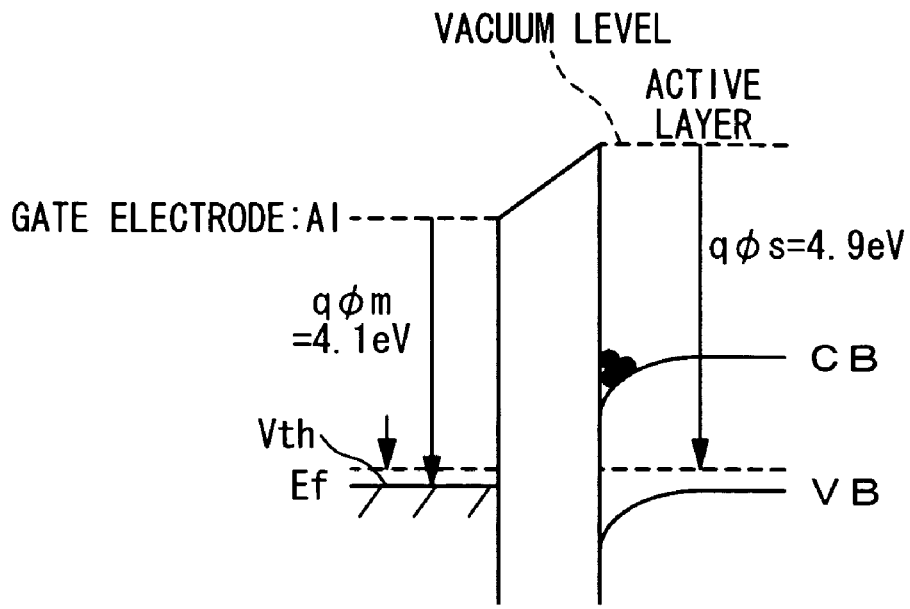
FIGS. 6A and 6B are diagrams illustrating energy bands of the MOS structure in a third state.
Figure 6B:
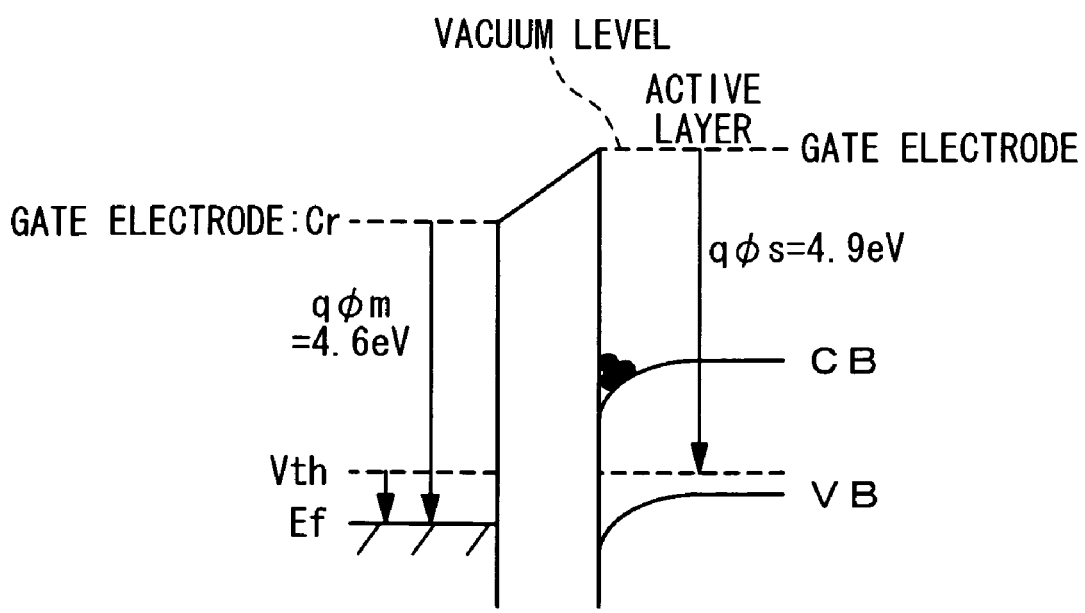
Figure 12A:
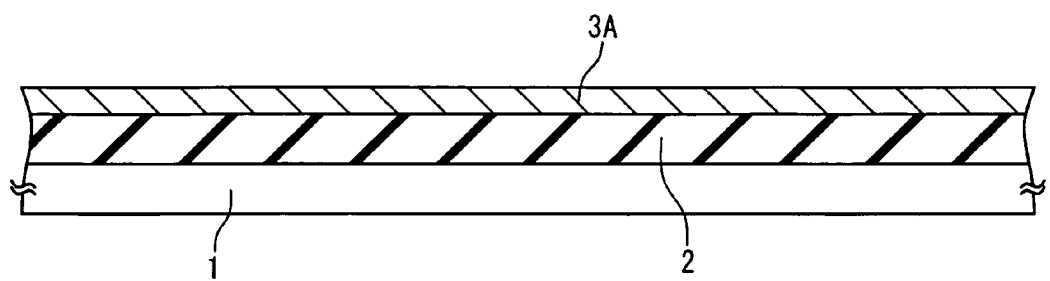
FIGS. 12A to 12I are cross-sectional views showing a first example of processes of manufacturing the thin film semiconductor device according to the first embodiment of the present invention.

First, as shown in FIG. 12A, an oxide film having a thickness of 100 nm which functions as an undercoat layer 2 is formed on the insulating substrate (glass substrate) 1 through the plasma CVD (abbreviated as "PCVD") method. The undercoat layer 2 has the effect of preventing any diffusion of an impurity such as sodium from the glass substrate 1 into a polysilicon film. Next, an amorphous silicon (a-Si) film 3A having a thickness of 40 nm which is a precursor of a polysilicon film is formed through the PCVD method. After the a-Si film 3A is formed, heat treatment is conducted at a temperature of 450° C. for 30 minutes in order to remove hydrogen which is caught in the a-Si film 3A during the PCVD film formation. Subsequently, the entire a-Si film 3A is channel-doped with B ions by using the ion injection method under a condition that a dose is $1.0\times10^{12}$ cm$^{-2}$ and an acceleration voltage is 10 keV. Although the dose of B is $1.0\times10^{12}$ cm$^{-2}$ in the first example, it should be preferably set within a range from $1.0\times10^{11}$ cm$^{-2}$ to $2.0\times10^{12}$ cm$^{-2}$ depending on a threshold voltage to be set and the thickness of the gate insulating film, with reference to the relationship shown in FIG. 3A.

Figure 12B:
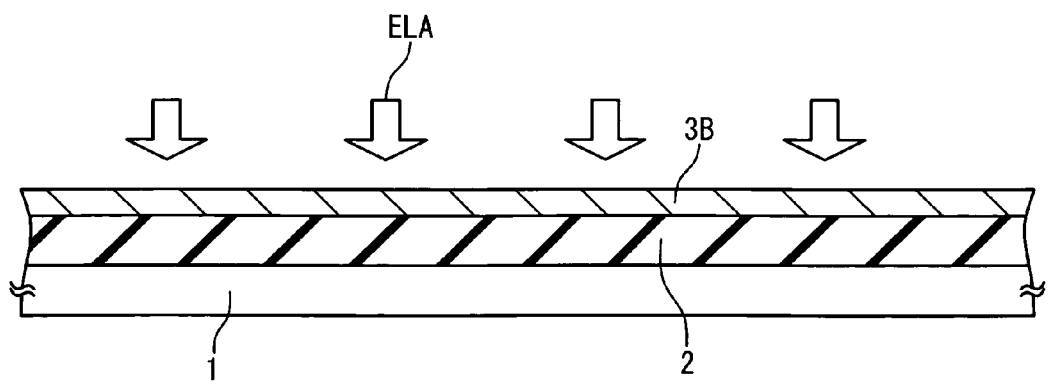

Next, as shown in FIG. 12B, the channel-doped a-Si film 3A is crystallized by annealing with an excimer laser beam (abbreviated as "ELA"). As a result, a polysilicon film (i.e., a poly-Si film) 3B is formed. Immediately after the ELA irradiation, the silicon contained in the thin film melts to be a liquid phase, and the dopant diffuses during a very short period of time to distribute uniformly in a film thickness direction. During the ELA irradiation, the film is scanned with a line beam in one direction. At that time, the irradiation intensity is 350 mJ/cm$^2$ and the beam overlapping rate is 95%.

Figure 12C:
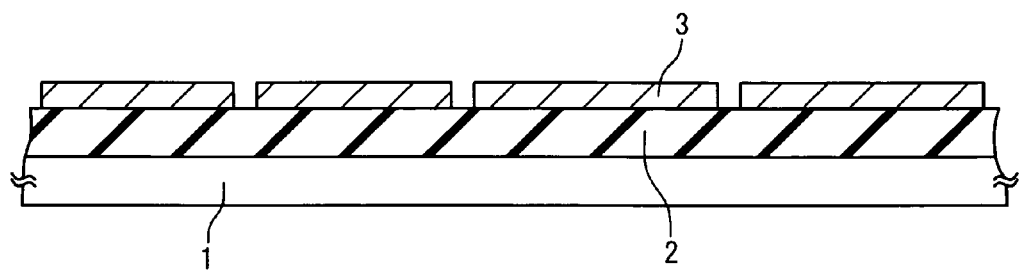

Next, as shown in FIG. 12C, four island-like polysilicon films 3 for the low-voltage n-channel TFT, the low-voltage p-channel TFT, the high-voltage n-channel TFT and the high-voltage p-channel TFT are formed by etching the poly-Si film 3B in an island shape.

Figure 12D:
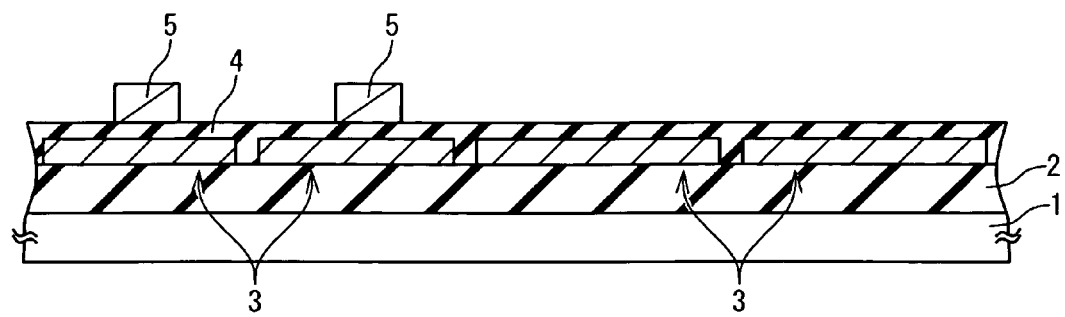

Next, as shown in FIG. 12D, the first gate insulating film 4 serving as gate insulating films of the low-voltage TFTs is formed by depositing an SiO$_2$ film with a thickness of 50 nm through the PCVD method. In a case where the drive voltage applied to the gate electrode ranges from 3.3 V to 10 V, the thickness of the first gate insulating film 4 is preferably set to a range from 20 nm to 100 nm. Subsequently, a polysilicon film of an n$^+$ type having a thickness of 250 nm is formed through the PCVD method. Then, the polysilicon film is etched selectively such that the gate electrode 5 of the low-voltage TFT is formed. Since a drain withstand voltage of the low-voltage TFT is required to be low (from 3.3 V to 10 V), a channel length is designed to be 4.0 μm.

Figure 12E:
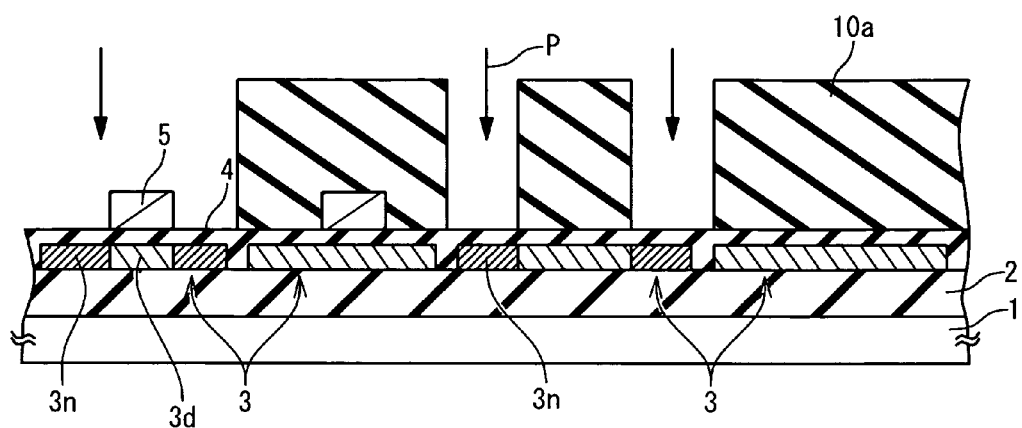

Next, as shown in FIG. 12E, the entire region of the p-channel TFTs and the channel region of the high-voltage n-channel TFT are covered with a resist pattern 10a. Then, the source-drain regions 3n of the n-channel TFTs are formed by injecting P ions. The dose of P is set to $1.0\times10^{15}$ cm$^{-2}$ and the acceleration voltage is set to 20 keV. A region of the island-like polysilicon film 3 sandwiched between the formed source-drain regions 3n functions as a P-doped channel region 3d of the low-voltage n-channel TFT.

Figure 12F:
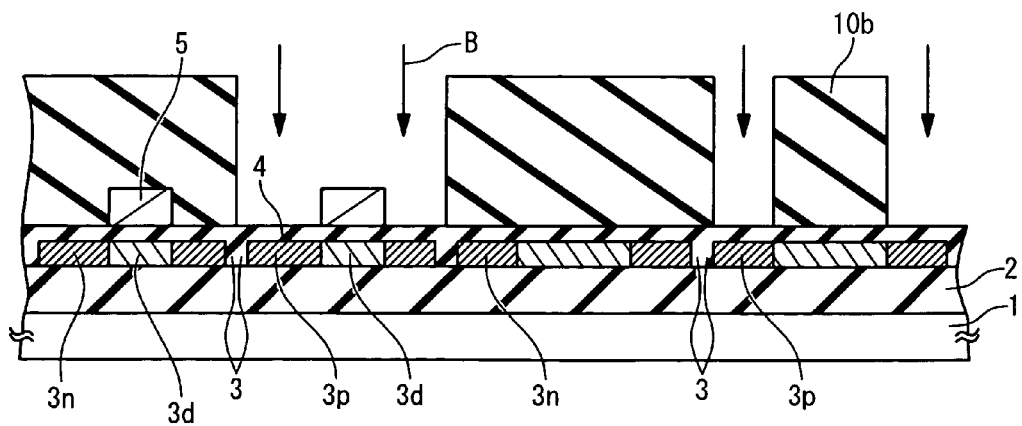

Next, as shown in FIG. 12F, the entire region of the n-channel TFTs and the channel region of the high-voltage p-channel TFT are covered with another resist pattern 10b. Then, the source-drain regions 3p of the p-channel TFTs are formed by injecting B ions with the use of the resist pattern 10b and the gate electrode 5 of the low-voltage p-channel TFT as masks. At this time, the dose of B ions is set to $1.0\times10^{15}$ cm$^{-2}$ and the acceleration voltage is set to 40 keV. A region of the island-like polysilicon film 3 sandwiched between the formed source-drain regions 3p functions as a B-doped channel region 3d of the low-voltage p-channel TFT. It should be noted that the doping processes for forming the source-drain regions with respect to the n-channel TFTs and the p-channel TFTs may be carried out in reverse order in the process for forming the source-drain regions.

Figure 12G:
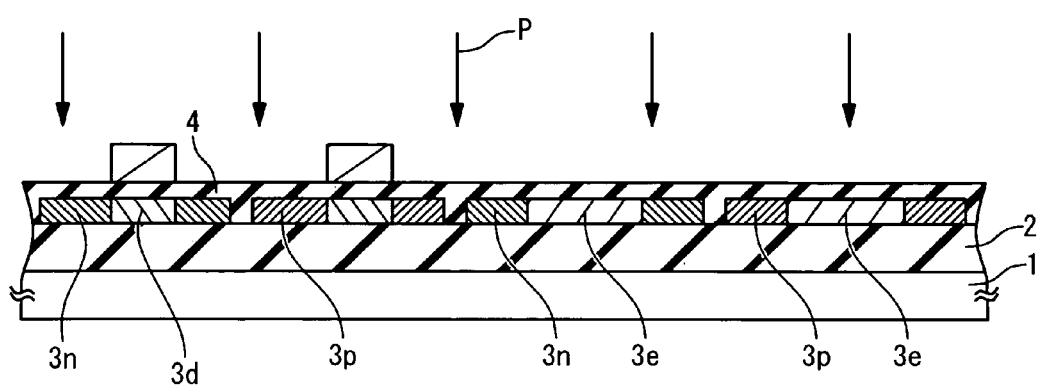

Next, as shown in FIG. 12G, P ions are doped at low concentration with respect to the channel regions of the high-voltage n-channel TFT and the high-voltage p-channel TFT by using the gate electrodes 5 of the low-voltage TFTs as masks without photolithography. As a result, B-and-P-doped channel regions 3e of the high-voltage TFTs are formed. Here, the dose of P is $8.0\times10^{11}$ cm$^{-2}$. Subsequently, the injected dopant is activated by light irradiation with an excimer laser beam. Thereafter, hydrogenation is carried out in order to enhance reliability of the device.

Figure 12H:
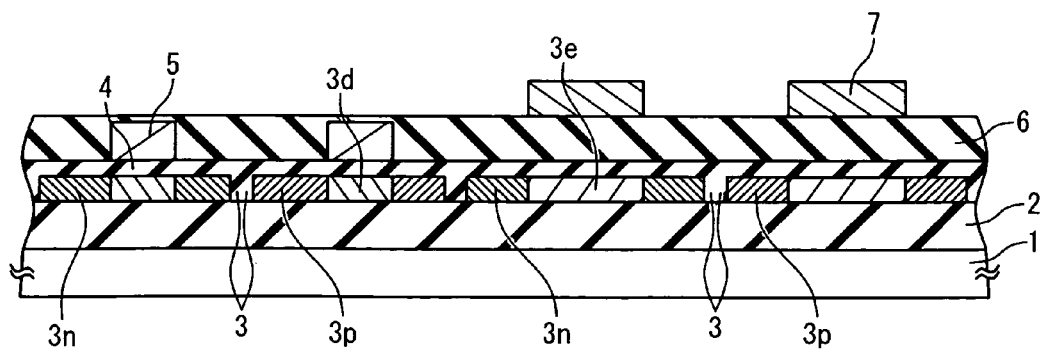

Next, as shown in FIG. 12H, an SiO$_2$ film with a thickness of 100 nm serving as a second gate insulating film 6 is deposited through the PCVD method. After that, an n+ type polysilicon film with a thickness of 250 nm is deposited. Then, the n+ type polysilicon film is patterned through the photolithography and the dry-etching, so that the gate electrodes 7 of the high-voltage TFTs are formed. Since a drain withstand voltage of the high-voltage TFT is required to be as high as 40 V, the channel length is designed to be 20 μm. In order to secure the reliability of the gate insulating film against 40 V, the thickness of the gate insulating film of the high-voltage TFT is designed to be as large as 150 nm.

Figure 12I:
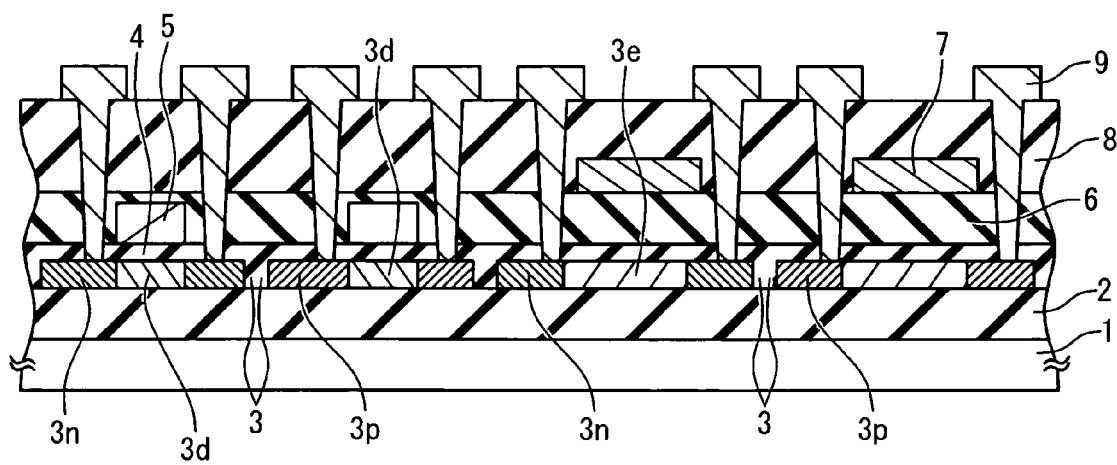

Next, as shown in FIG. 12I, an SiO$_2$ film with a thickness of 300 nm serving as the interlayer insulating film 8 is formed through the PCVD method, such that the total thickness of the SiO$_2$ film on the island-like polysilicon film 3 becomes 500 nm. After that, contact holes are formed over the source-drain regions. Subsequently, Si-containing Al is deposited in a thickness of 400 nm through the sputtering method, and then it is patterned to be the electrodes 9. The aluminum containing silicon in a few quantity has an effect of reducing a contact resistance against polysilicon.

Thereafter, an interlayer insulating film, a wiring, an electrode and the like are further formed, as required. In addition, in a case where the TFTs are integrated at a high density on the substrate, it is preferable to provide a multi-layer wiring structure.

Figure 13:
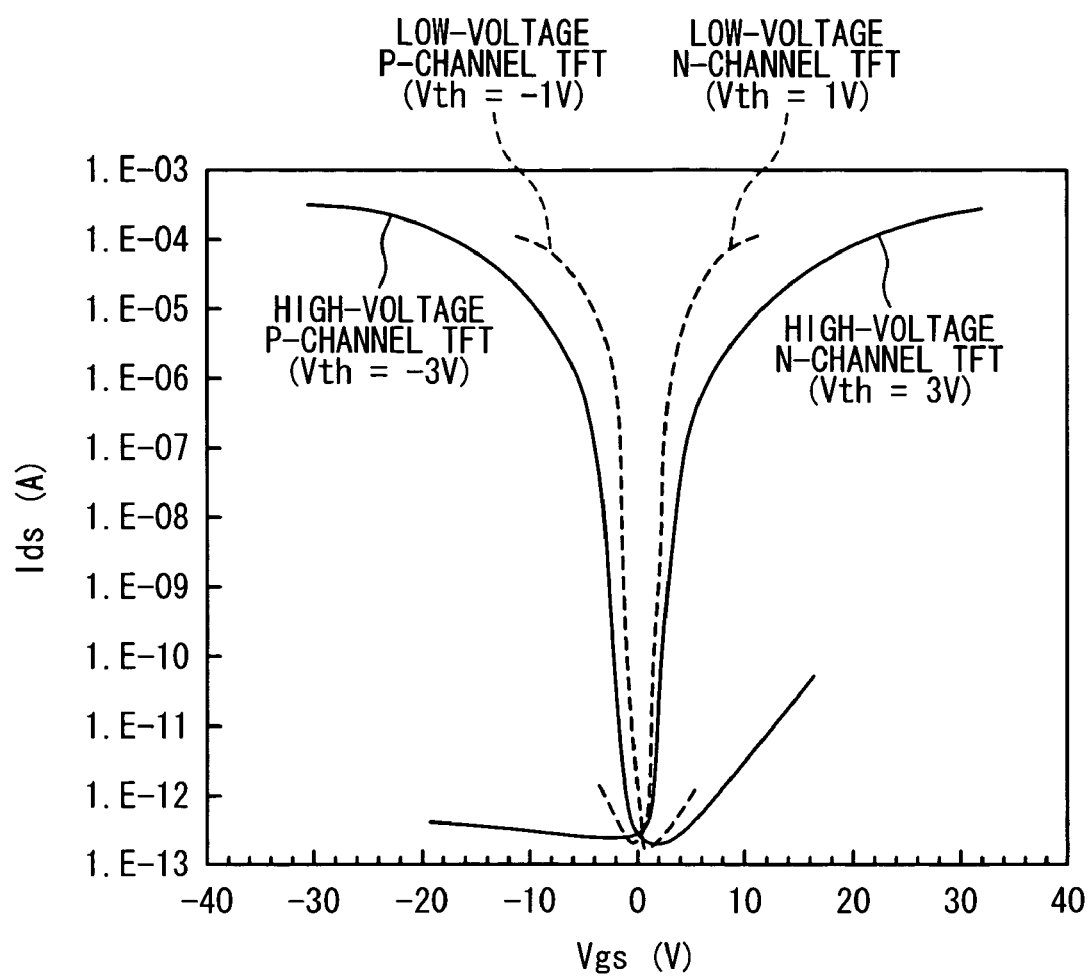
FIG. 13 is a graph illustrating Id-Vg characteristics as an advantageous result according to the present invention.

FIG. 13 illustrates Id-Vg characteristics of the low-voltage TFTs and the high-voltage TFTs which are manufactured by the foregoing method. As shown in FIG. 13, the threshold voltage (Vth) of the low-voltage n-channel TFT is +1 V and the threshold voltage (Vth) of the high-voltage n-channel TFT is +3 V. The threshold voltage of the low-voltage p-channel TFT is −1 V and the threshold voltage of the high-voltage p-channel TFT is −3V. As described above, symmetric Id-Vg characteristics can be obtained with regard to the n-channel TFT and the p-channel TFT.

SECOND EXAMPLE

FIGS. 14A to 14F are cross-sectional views showing a second example of processes of manufacturing the thin film semiconductor device according to the first embodiment of the present invention. In FIGS. 14A to 14F, common elements with the first example shown in FIGS. 12A to 12I are designated by the same reference numerals, and redundant descriptions will be appropriately omitted below.

Figure 14A:
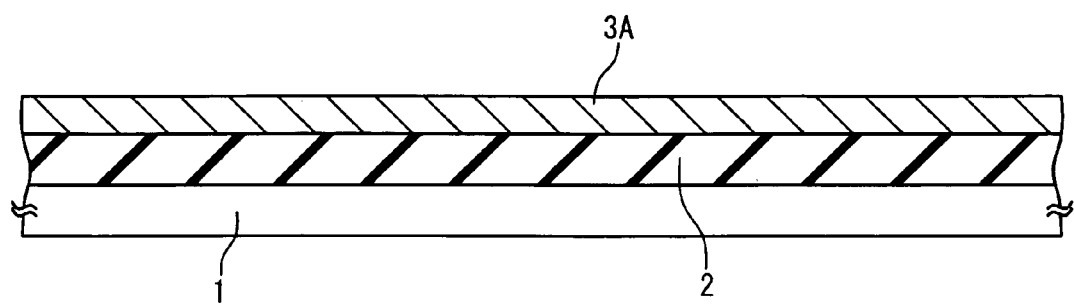
FIGS. 14A to 14F are cross-sectional views showing a second example of processes of manufacturing the thin film semiconductor device according to the first embodiment of the present invention.
Figure 14B:
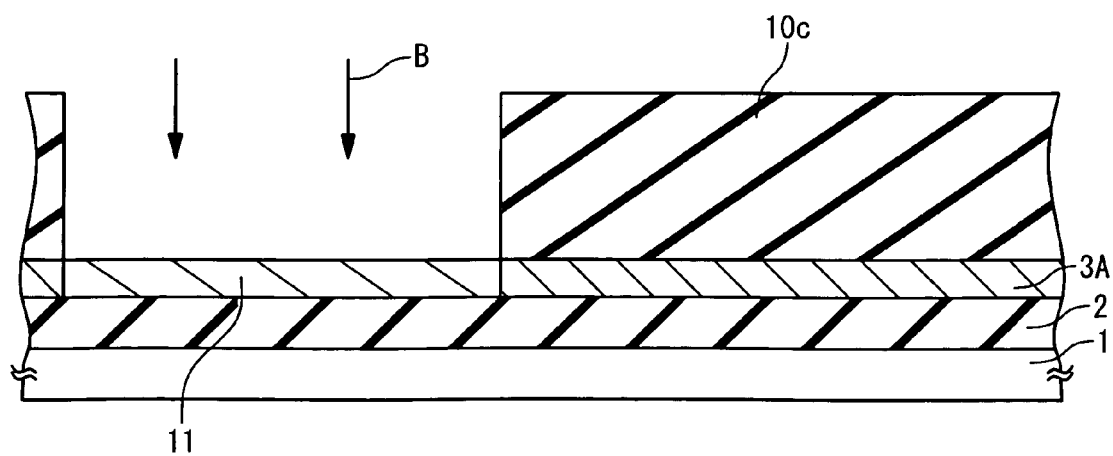

As shown in FIG. 14A, the undercoat layer 2 is formed on the insulating substrate 1 and then the a-Si film 3A with a thickness of 40 nm is formed on the undercoat layer 2 in the same manner as the first example. Subsequently, as shown in FIG. 14B, a resist pattern 10c having an opening over the low-voltage TFT forming region is formed on the a-Si film 3A. Then, B ions are injected under a condition that the dose is $1.0\times10^{12}$ cm$^{-2}$ and the acceleration voltage is 10 keV. As a result, a B-doped region 11 is formed in the non-doped a-Si film 3A.

Figure 14C:
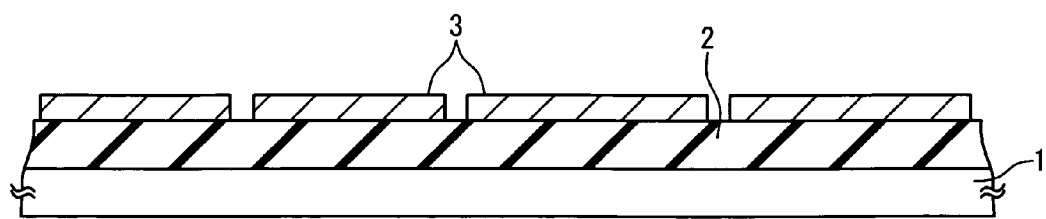

After the crystallization of the a-Si film 3A through the laser annealing, island-like polysilicon films 3 are formed by etching the polysilicon film, as shown in FIG. 14C.

Figure 14D:
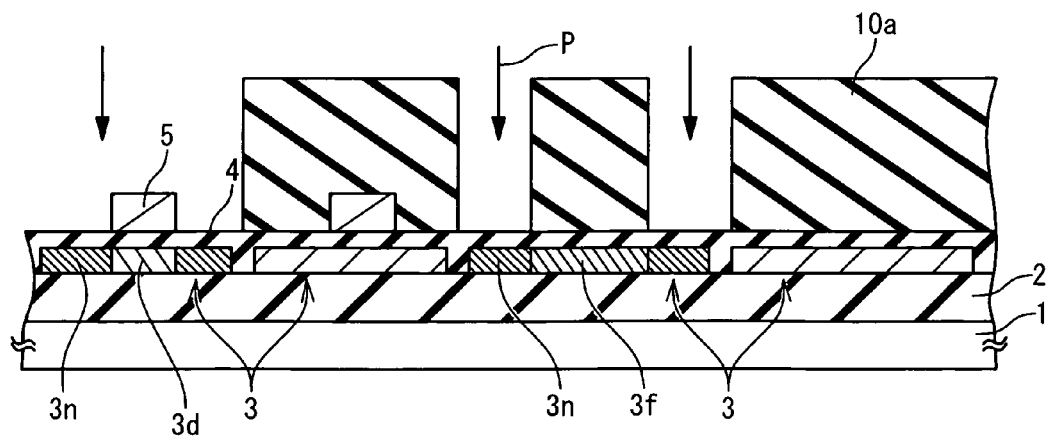

Next, as shown in FIG. 14D, the first gate insulating film 4 is formed by depositing an SiO$_2$ film with a thickness of 50 nm. Then, the gate electrode 5 made of n$^+$ type polysilicon with a thickness of 250 nm is formed on the first gate insulating film 4. Thereafter, the entire region of the p-channel TFTs and the channel region of the high-voltage n-channel TFT are covered with the resist pattern 10a. Then, the source-drain regions 3n of the n-channel TFTs are formed by injecting P ions by the use of the resist pattern 10a and the gate electrode 5 as masks. The polysilicon film sandwiched between the formed source-drain regions 3n serves as a doped channel region 3d of the low-voltage n-channel TFT or a non-doped channel region 3f of the high-voltage n-channel TFT.

Figure 14E:
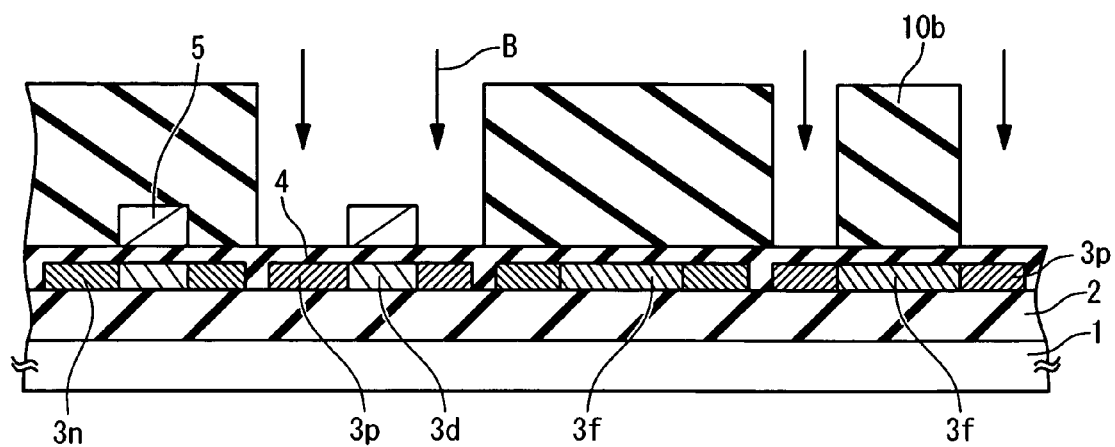

Next, as shown in FIG. 14E, the entire region of the n-channel TFTs and the channel regions of the high-voltage p-channel TFT are covered with another resist pattern 10b. Then, the source-drain regions 3p of the p-channel TFTs are formed by injecting B ions by the use of the resist pattern 10b and the gate electrode 5 as masks. The polysilicon film sandwiched between the formed source-drain regions 3p serves as a doped channel region 3d of the low-voltage p-channel TFT or a non-doped channel region 3f of the high-voltage p-channel TFT.

Figure 14F:
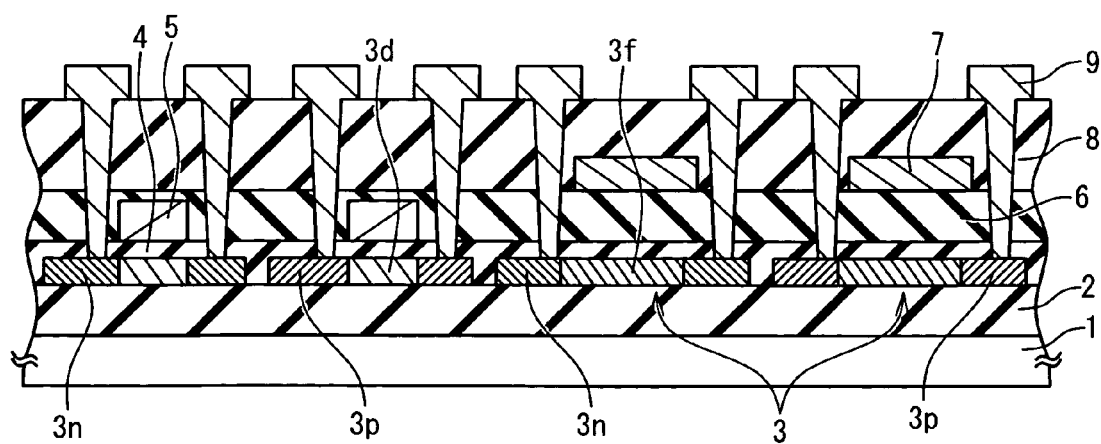

After that, as shown in FIG. 14F, the second gate insulating film 6 with a thickness of 100 nm is formed. Then, the gate electrodes 7 of the high-voltage TFT with a thickness of 250 nm made of n$^+$ type polysilicon is formed on the second gate insulating film 6. Further, the interlayer insulating film 8 is formed on the gate electrode 7, and then the electrodes 9 are formed after providing contact holes.

In the present example, the dose of the B ion is set to $1.0 \times 10^{12}$ cm$^{-2}$. The dose may be appropriately set within a range from $1.0 \times 10^{11}$ cm$^{-2}$ to $2.0 \times 10^{12}$ cm$^{-2}$ depending on the threshold voltage to be set and the thickness of the gate insulating film, with reference to the relationship shown in FIG. 3A.

In addition, impurities are not doped into the channel region of the high-voltage TFT according to the present example. However, depending on the required threshold voltage, B ions can be injected into the channel region of the high-voltage TFT. In this case, the dose of the B ions is set less than that for the low-voltage TFT, that is, within the range from $1.0 \times 10^{11}$ cm$^{-2}$ to $2.0 \times 10^{12}$ cm$^{-2}$. Such the ion injection can be carried out by covering the low-voltage TFTs forming region with a mask or without any resist mask.

Furthermore, P ions may be channel-injected with respect to the channel regions of both of the low-voltage p-channel TFT and the high-voltage p-channel TFT, depending on the required threshold voltage. In this case, the threshold voltages of the p-channel TFTs shift toward the negative direction. The channel-injection can be achieved by, for example, forming a resist pattern having an opening over the channel regions of the low-voltage p-channel TFT and the high-voltage p-channel TFT, and then injecting P ions with using the formed resist pattern as a mask. Here, the dose of the P ions in the ion injection depends upon the threshold voltage to be set, and it may be set to $1.0 \times 10^{12}$ cm$^{-2}$, for example. The acceleration voltage may be set to 70 keV.

THIRD EXAMPLE

The a-Si film 3A is formed as shown in FIG. 14A in the same manner as in the second example. Then, as shown in FIG. 14B, the resist pattern 10c having an opening over the low-voltage TFT forming region is formed. After that, B ions are injected under a condition that the dose is $1.0 \times 10^{12}$ cm$^{-2}$ and the acceleration voltage is 10 keV. As a result, a B-doped region is formed in the low-voltage TFT forming region. Subsequently, another resist pattern having an opening over the high-voltage TFT forming region, namely, a resist film whose pattern is reverse to that shown in FIG. 14B is formed. After that, P ions are injected under a condition that the dose is $1.0 \times 10^{11}$ cm$^{-2}$ and the acceleration voltage is 80 keV. As a result, a P-doped region is formed in the high-voltage TFT forming region. Thereafter, a thin film semiconductor device is manufactured through the same processes as in the second example. Here, aluminum is used as material of the gate electrodes of each of the low-voltage TFT and the high-voltage TFT.

According to the third example, the channel doping with respect to the high-voltage TFTs can be suppressed to the minimum. It is thus possible to suppress scattering of the carriers between the source and the drain.

FOURTH EXAMPLE

The a-Si film 3A is formed as shown in FIG. 14A in the same manner as in the second example. Then, B ions are injected without using any mask under a condition that the dose is $1.0 \times 10^{12}$ cm$^{-2}$ and the acceleration voltage is 10 keV. As a result, the entire of the a-Si film 3A becomes a B-doped region. Thereafter, executed are such processes as crystallization, patterning to the island regions, formation of the first gate insulating film with a thickness of 50 nm, and formation of the gate electrode (Al) of the low-voltage TFT. As a result, the film is processed to be a state shown in FIG. 12D. After that, P ions are injected under a condition that the dose is $2.0 \times 10^{12}$ cm$^{-2}$ and the acceleration voltage is 80 keV, so that the island-like polysilicon film of the high-voltage TFT becomes a B-and-P-doped region. After that, the source-drain regions of the p-channel TFTs and the source-drain regions of the n-channel TFTs are formed through the photolithography and the ion injection. Subsequently, the second gate insulating film with a thickness of 150 nm and a gate electrode (Al) of the high-voltage TFT are formed.

According to the present example, the thickness of the gate insulating film of the high-voltage TFT becomes as large as 200 (=50+150) nm. However, it is possible to suppress the threshold voltages of the high-voltage p-channel TFT and the high-voltage n-channel TFT to a low level by channel-doping the P ions with the large amount of dose.

Second Embodiment

Figure 15:
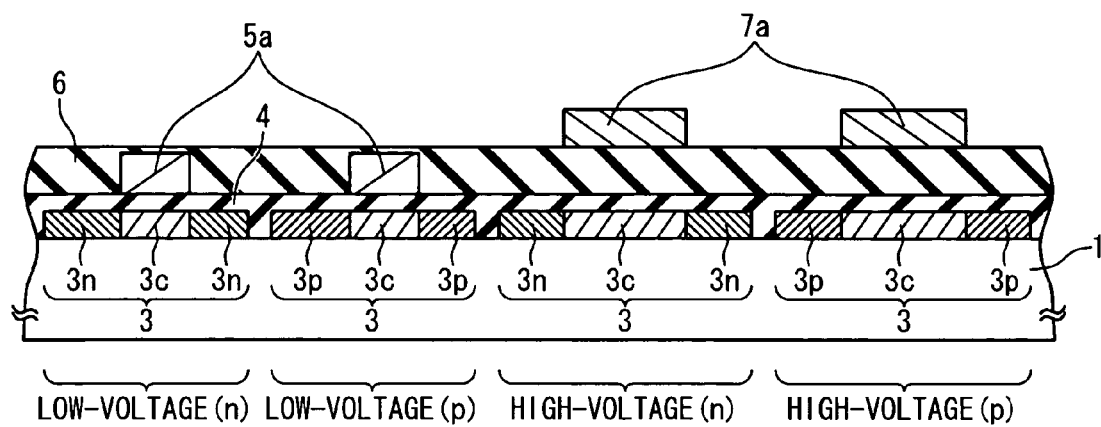
FIG. 15 is a cross-sectional view showing a thin film semiconductor device according to a second embodiment of the present invention.

FIG. 15 is a cross-sectional view showing a thin film semiconductor device according to a second embodiment of the present invention. Unlike in the case of the above-mentioned first embodiment, the channel-doping with respect to the low-voltage TFT and the high-voltage TFT is the same. Instead, gate electrodes of the low-voltage TFT and the high-voltage TFT are formed by using materials having different work functions according to the present embodiment. As shown in FIG. 15, the island-like polysilicon films 3 which serve as active regions of the respective transistors are independently provided on the insulating substrate 1. Gate electrodes 5a with relatively high work function for the low-voltage TFTs are formed on some of the island-like polysilicon films 3 through the first gate insulating film 4. Moreover, gate electrodes 7a with relatively low work function for the high-voltage TFTs are formed on the other of the island-like polysilicon films 3 through the first gate insulating film 4 and a second gate insulating film 6.

In the island-like polysilicon films 3 for both of the low-voltage n-channel TFT and the high-voltage n-channel TFT, the source-drain regions 3n into which n-type impurity is doped at a high density are formed. On the other hand, in the island-like polysilicon films 3 for both of the low-voltage p-channel TFT and the high-voltage p-channel TFT, source-drain regions 3p into which p-type impurity is doped at a high density are formed. A channel region 3c sandwiched between the source-drain regions have the same impurity doping state with regard to all the transistors according to the present embodiment.

Figure 7:
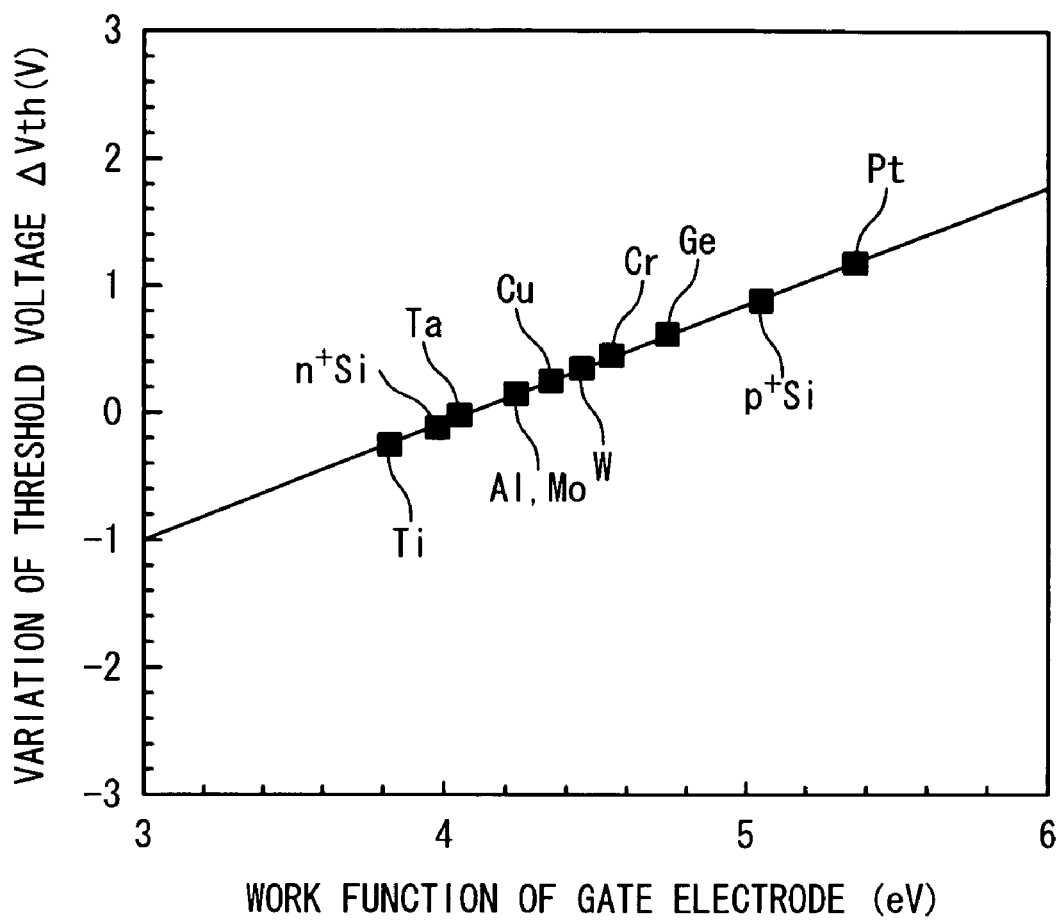
FIG. 7 is a graph illustrating a relationship between variation of threshold voltage and work function of gate electrode material.

In the present embodiment, a material having a relatively high work function is selected out of, for example, the materials shown in FIG. 7 as a material of the gate electrode 5a of the low-voltage TFT having high work function. On the other hand, a material having a relatively low work function is selected out of, for example, the materials shown in FIG. 7 as a material of the gate electrode 7a of the high-voltage TFT having low work function. The selection of the materials depends on the required threshold voltages of the low-voltage TFT and the high-voltage TFT.

Although the impurity concentration in the all channel regions 3c is set to be the same in the above description, the impurity concentration in the channel regions 3c can be appropriately designed to be different from each other. In addition, the first embodiment and the second embodiment can be combined.

It should be noted in the present embodiment that the gate electrode can have a multi-layer structure made of a plurality of conductive materials. In this case, it is enough to consider work function of the material of the lowermost layer of the multi-layer structure (i.e., a layer nearest the channel region). For example, work function of silicon doped with a donor (e.g. P) at a high density is 3.9 eV and relatively low. Such a silicon is suitable for the material of the gate electrode 7a of the high-voltage TFT in which the threshold voltage should be adjusted to be lower. In contrast, work function of silicon doped with an acceptor (e.g. B) at a high density is 5.1 eV and relatively high. Such a silicon is suitable for the material of the gate electrode 5a of the low-voltage TFT in which the threshold voltage should be adjusted to be higher. In a case when such materials are used and it is desired to reduce resistance of gate wirings, a structure including wirings with low resistance and a multi-layer gate electrode may be adopted by laminating aluminum or copper on the doped silicon.

Figure 16:
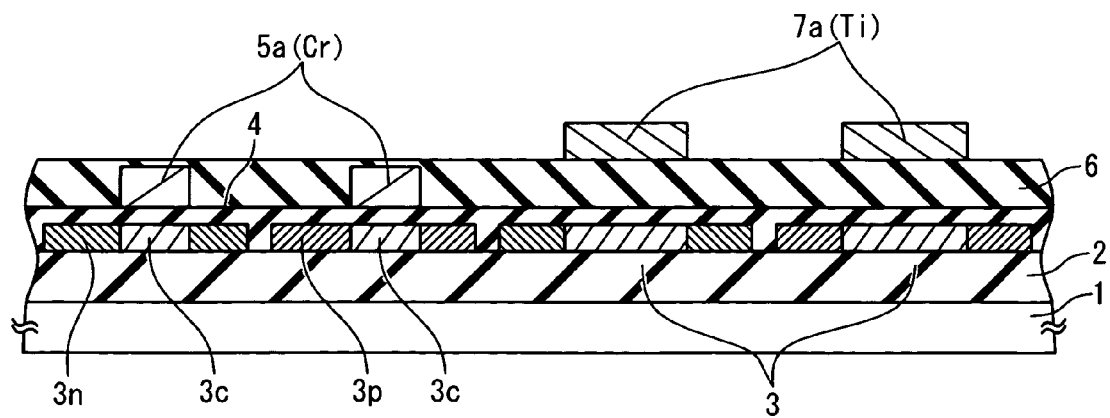
FIG. 16 is a cross-sectional view showing an example of the thin film semiconductor device according to the second embodiment of the present invention.

FIG. 16 is a cross-sectional view showing an example of the thin film semiconductor device according to the present embodiment. A manufacturing method in the present example is the same as that in the foregoing examples except that the channel regions of all the TFTs are non-doped and the gate electrode is made of metallic material. In FIG. 16, common elements with the foregoing examples shown in FIGS. 12A to 12I and FIGS. 14A to 14F are designated by the same reference numerals, and redundant descriptions will be appropriately omitted below. Explanation will be made mainly on the gate electrode of each of the low-voltage TFT and the high-voltage TFT.

The gate electrode 5 of the low-voltage TFT is made of chromium (Cr) having a relatively high work function. On the other hand, the gate electrode 7 of the high-voltage TFT is made of titanium (Ti) having a relatively low work function. As a consequence, the thin film semiconductor device having characteristics similar to those in the first embodiment (see FIG. 13) is provided.

In the present example, the gate electrode 5 of the low-voltage TFT is made of Cr, and the gate electrode 7 of the high-voltage TFT is made of Ti. However, other materials can be also used depending on the required threshold voltages. For example, work function of silicon doped with P as a donor at a high density is 3.9 eV and relatively low. Such a silicon is suitable for the material of the gate electrode 7a of the high-voltage TFT in which the threshold voltage should be adjusted to be lower. In contrast, work function of silicon doped with B as an acceptor at a high density is 5.1 eV and relatively high. Such a silicon is suitable for the material of the gate electrode 5a of the low-voltage TFT in which the threshold voltage should be adjusted to be higher. Moreover, the channel regions may be doped with an acceptor or a donor at a low density according to the present embodiment.

Third Embodiment

In the foregoing embodiments, the source-drain region is formed to have a single drain (abbreviated as "SD") structure. However, the source-drain region can be formed to have an LDD (Lightly Doped Drain) structure. More specifically, each of the source-drain regions of the low-voltage TFT and the high-voltage TFT can be formed to include a source-drain region doped with high density impurity and a source-drain region doped with low density impurity (i.e., a so-called LDD region). In this case, both of the source-drain region doped with high density impurity and the source-drain region doped with low density impurity may be formed by using a resist pattern as the mask. Alternatively, the source-drain region doped with low density impurity (the LDD region) may be formed by using the gate electrode as the mask. All of the transistors may be formed to have the LDD structure. Alternatively, only the high-voltage TFTs or only the high-voltage n-channel TFT may be formed to have the LDD structure.

Figure 17A:
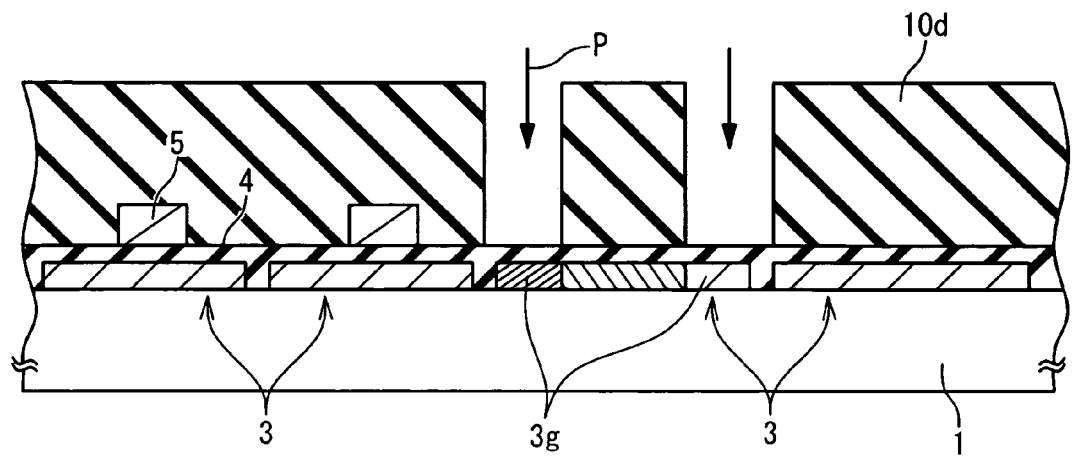
FIGS. 17A to 17C are cross-sectional views showing an example of processes of manufacturing a thin film semiconductor device having a high-voltage TFT with an LDD structure according to a third embodiment of the present invention.
Figure 17B:
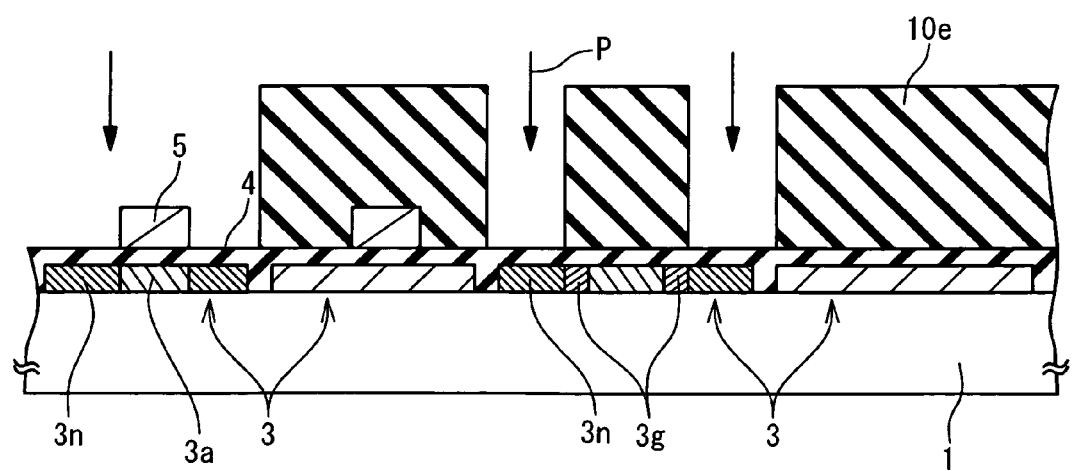
Figure 17C:
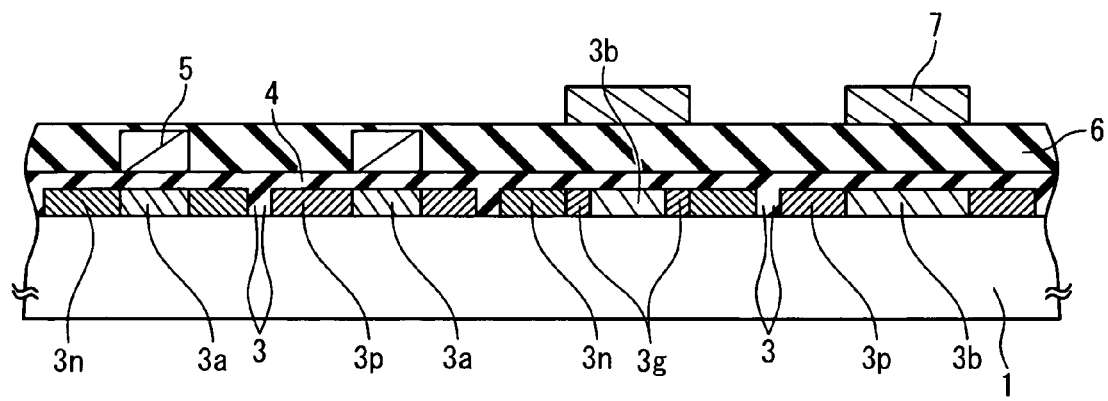

FIGS. 17A to 17C are cross-sectional views showing an example of processes of manufacturing a thin film semiconductor device according to a third embodiment of the present invention. In the example, only the high-voltage n-channel TFT is formed to have the LDD structure. As shown in FIG. 17A, the island-like polysilicon films 3 doped with a p-type impurity (wherein a region not further doped with the impurity is referred to the acceptor intensified region 3a) are formed on the insulating substrate 1 in a TFT forming region. The first gate insulating film 4 is formed on the island-like polysilicon films 3, and the gate electrodes 5 of the low-voltage TFTs are formed on the first gate insulating film 4. Subsequently, provided is a resist pattern 10d having an opening over a region in which the source-drain region (including the LDD region) of the high-voltage n-channel TFT is to be formed. Then, n-type impurity such as P ions is implanted with a low dose such that an LDD region 3g is formed.

Next, as shown in FIG. 17B, the entire region of the p-channel TFTs, the channel region of the high-voltage n-channel TFT and a region which should remain as the LDD region 3g are covered with a resist pattern 10e. Then, n-type impurity such as P ions is implanted with a high dose such that the source-drain regions 3n of the n-channel TFTs doped with the high density impurity are formed.

Thereafter, as shown in FIG. 17C, the source-drain regions 3p of the high-voltage p-channel TFT and the low-voltage p-channel TFT are formed. Then, the channel region of the high-voltage TFT is channel-doped by injecting the n-type impurity without using any resist mask, thereby forming the donor intensified region 3b. After that, the second gate insulating film 6 and the gate electrodes 7 of the high-voltage TFTs are formed.

In the above-described processes, the process for forming the LDD region 3g, the process for forming the source-drain regions 3n or 3p doped with the high density impurity, and the process for forming the donor intensified region 3b may be appropriately counterchanged.

Figure 18A:
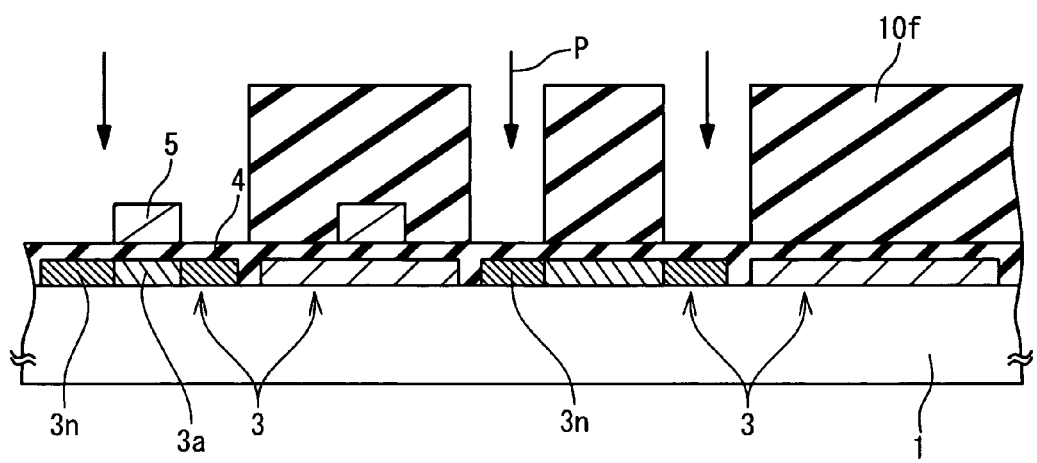
FIGS. 18A to 18C are cross-sectional views showing another example of processes of manufacturing a thin film semiconductor device having a high-voltage TFT with an LDD structure according to the third embodiment of the present invention.
Figure 18B:
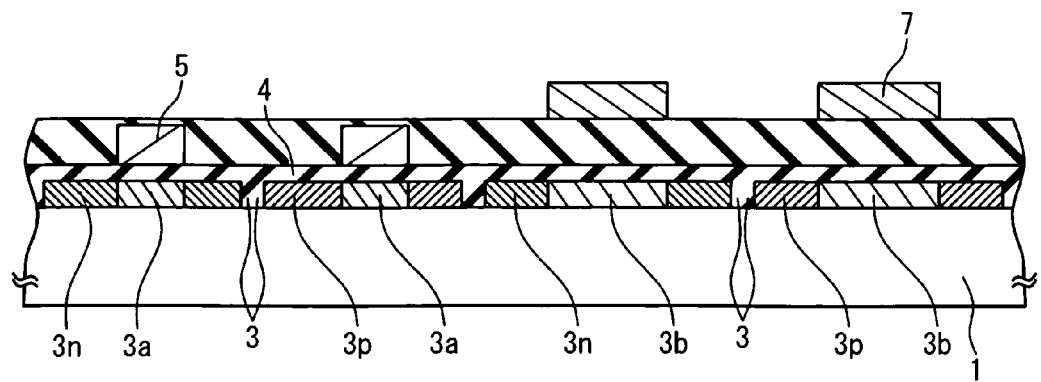
Figure 18C:
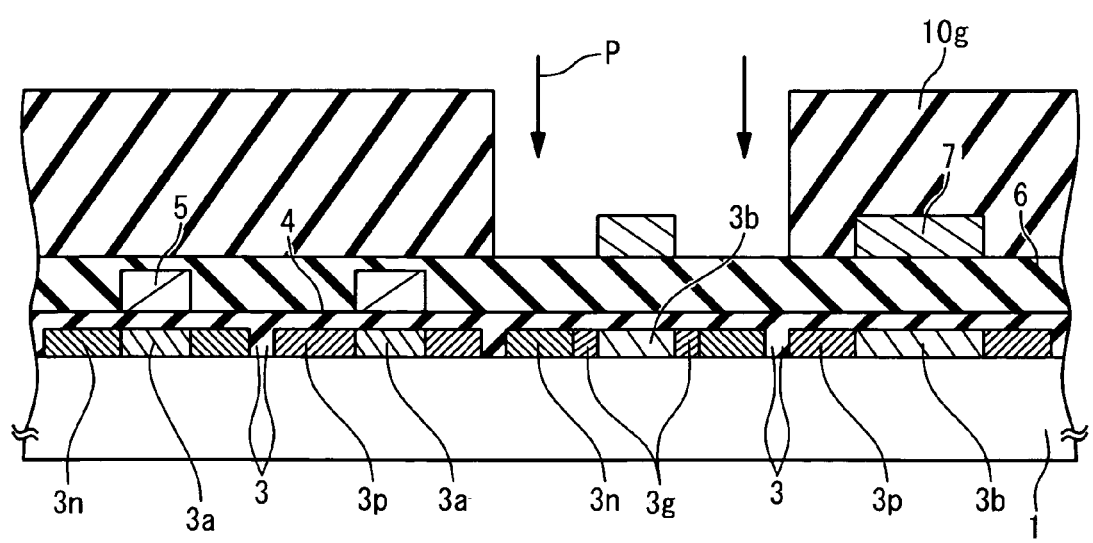

FIGS. 18A to 18C are cross-sectional views showing another example of processes of manufacturing a thin film semiconductor device according to the third embodiment of the present invention. In the example, only the high-voltage n-channel TFT is formed to have the LDD structure. As shown in FIG. 18A, the island-like polysilicon films 3 doped with a p-type impurity (wherein a region not further doped with the impurity is referred to the acceptor intensified region 3a) are formed on the insulating substrate 1 in a TFT forming region. The first gate insulating film 4 is formed on the island-like polysilicon films 3, and the gate electrodes 5 of the low-voltage TFTs are formed on the first gate insulating film 4. Subsequently, provided is a resist pattern 10f having an opening over a region in which the low-voltage n-channel TFT and the source-drain regions of the high-voltage n-channel TFT are to be formed. Then, n-type impurity such as P ions is implanted with a high dose such that the source-drain regions 3n of the n-channel TFTs doped with the high density impurity are formed.

Next, as shown in FIG. 18B, the source-drain regions 3p of the low-voltage p-channel TFT and the high-voltage p-channel TFT are formed, and the donor intensified regions 3b of the high-voltage TFTs are formed by injecting the n-type impurity without using any resist mask. After that, the second gate insulating film 6 and the gate electrodes 7 of the high-voltage TFTs are formed.

Thereafter, as shown in FIG. 18C, provided is a resist pattern 10g having an opening over a region in which the high-voltage n-channel TFT is to be formed. Then, the n-type impurity such as P ions are implanted with a low dose by using the resist pattern 10g and the gate electrode 7 of the high-voltage n-channel TFT as masks. As a result, the LDD region 3g is formed. Then, the resist pattern 10g is removed.

Also in the present example shown in FIGS. 18A to 18C, the process for forming the source-drain regions 3n or 3p doped with the impurity at the high density and the process for forming the donor intensified region 3b may be appropriately counterchanged.

Fourth Embodiment

In the foregoing embodiments, each kind of the n-channel TFT and the p-channel TFT includes both the high-voltage TFT and the low-voltage TFT. However, any one kind of the n-channel TFT and the p-channel TFT can include both the high-voltage TFT and the low-voltage TFT. Also, the thin film semiconductor device according to the present invention may have any one kind of the n-channel TFT and the p-channel TFT. In a case where the thin film semiconductor device has only the n-channel TFTs, it is possible to achieve a high-speed thin film semiconductor device. On the other hand, in a case where the thin film semiconductor device has only the p-channel TFTs, it is possible to achieve a thin film semiconductor device with a high withstand voltage.

Figure 19A:
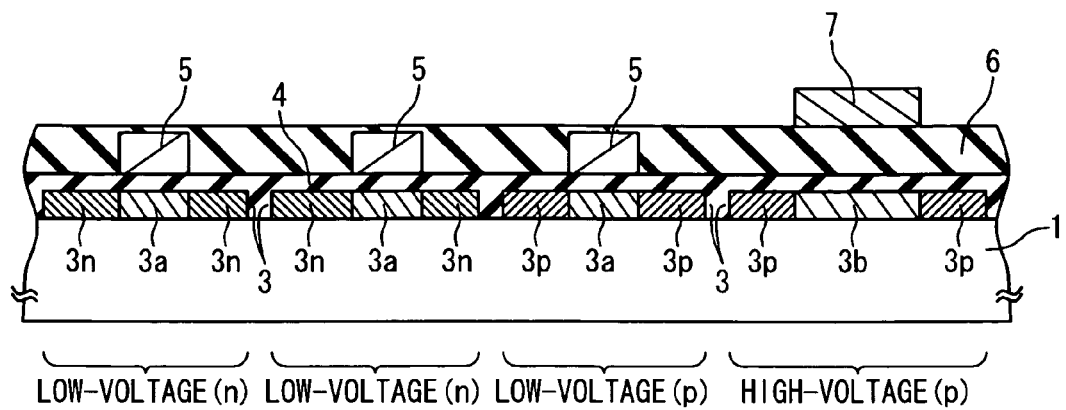
FIGS. 19A to 19C are cross-sectional views showing an example of processes of manufacturing a thin film semiconductor device according to a fourth embodiment of the present invention.
Figure 19B:
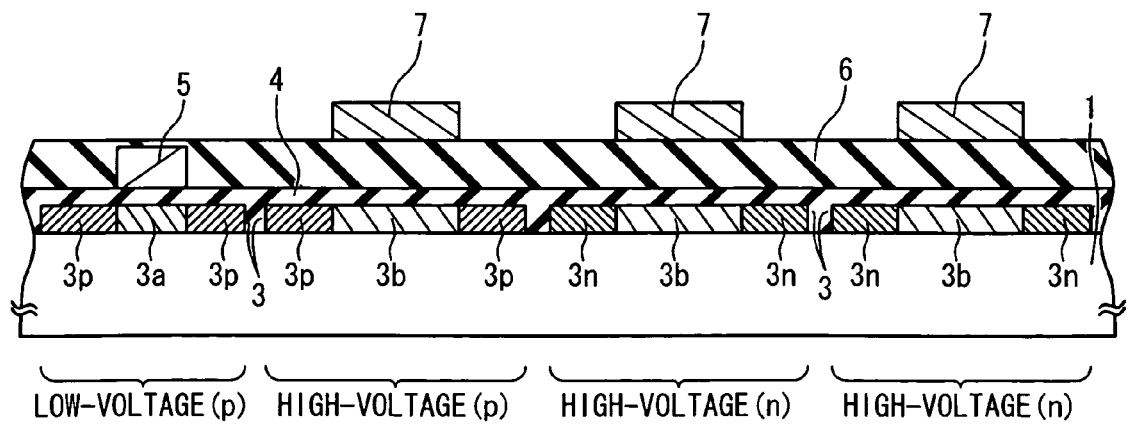
Figure 19C:
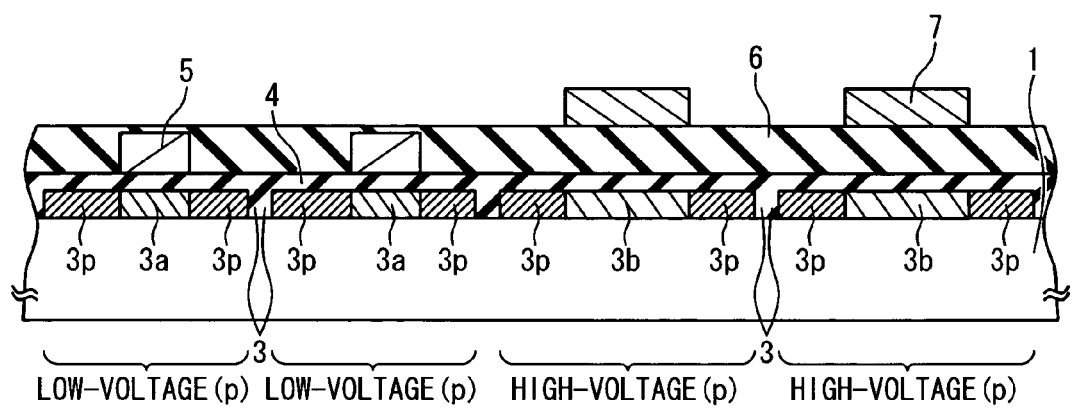

FIGS. 19A to 19C are cross-sectional views showing examples of a thin film semiconductor device according to a fourth embodiment of the present invention. In FIGS. 19A to 19C, only the p-channel TFT includes both of the low-voltage TFT and the high-voltage TFT. More specifically, FIG. 19A illustrates an example in which the n-channel TFT includes only the low-voltage TFT, and the p-channel TFT includes both of the low-voltage TFT and the high-voltage TFT. FIG. 19B illustrates another example in which the n-channel TFT includes only the high-voltage TFT, and the p-channel TFT includes both of the low-voltage TFT and the high-voltage TFT. Moreover, FIG. 19C illustrates a still another example in which the thin film semiconductor device has only the low-voltage p-channel TFT and the high-voltage p-channel TFT. Next, a detailed description will be given below on the thin film semiconductor device shown in FIG. 19C.

First, an oxide film with a thickness of 100 nm serving as an undercoat layer is formed on the insulating substrate 1 through the PCVD method. On the undercoat layer, an a-Si film having a thickness of 40 nm is formed on the undercoat layer through the PCVD method. After B ions are injected under a condition that the dose is $1.0 \times 10^{12}$ cm$^{-2}$ and the acceleration voltage is 10 keV, the poly-crystallization is performed through the laser annealing. Then, the polysilicon film is patterned such that a plurality of island-like polysilicon films 3 are formed.

Next, the first gate insulating film 4 is formed by depositing an SiO$_2$ film with a thickness of 50 nm through the PCVD method. Thereafter, a polysilicon film of n$^+$ type having a thickness of 250 nm is deposited through the PCVD method. Then, the polysilicon film is etched selectively to form the gate electrodes 5 of the low-voltage TFTs. Subsequently, the channel regions of the high-voltage p-channel TFTs are covered with a resist pattern, and then, B ions are injected by using the resist pattern and the gate electrodes 5 of the low-voltage p-channel TFTs as masks under a condition that the dose is $1.0 \times 10^{15}$ cm$^{-2}$ and the acceleration voltage is 40 keV. As a result, the source-drain regions 3p of the low-voltage TFT and the high-voltage TFT are formed. Thereafter, P ions are injected with a dose of $8.0 \times 10^{11}$ cm$^{-2}$ without using any mask such that only the channel regions of the high-voltage TFTs are doped with a donor. After that, an SiO$_2$ film with a thickness of 100 nm serving as the second gate insulating film 6 is deposited through the PCVD method, and n$^+$ type polysilicon film with a thickness of 250 nm is deposited. Then, the polysilicon film is patterned such that the gate electrodes 7 of the high-voltage TFTs are formed.

Thereafter, the interlayer insulating film is formed, the contact holes are formed, and necessary electrodes and wirings are formed. As a result of measurement of characteristics, the threshold voltage of the low-voltage TFT is −1 V and the threshold voltage of the high-voltage TFT is −3 V (see FIG. 13).

Figure 20:
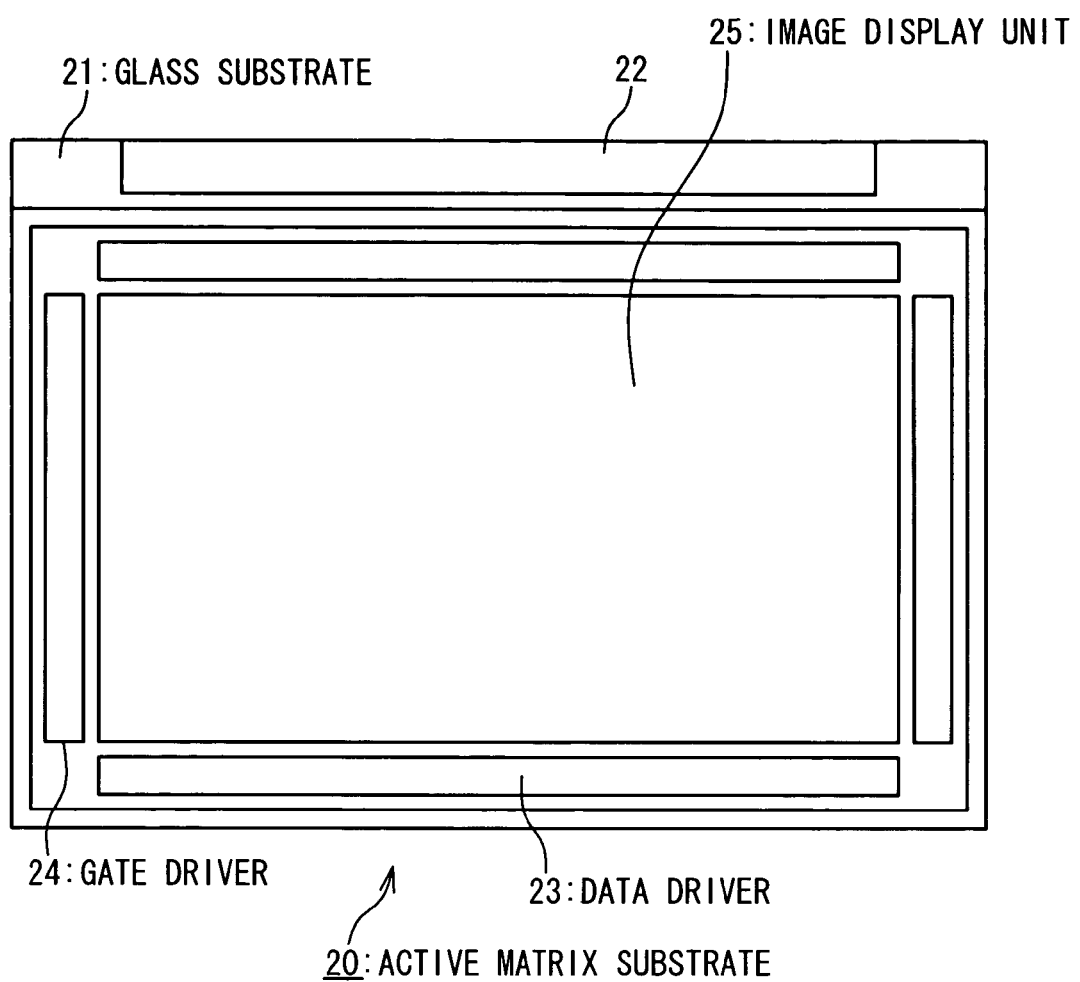
FIG. 20 is a plan view showing an active matrix substrate in which the low-voltage TFTs and the high-voltage TFTs according to the present invention are combined together.

The thin film semiconductor device according to the present invention can be applied to a device in which the high-voltage TFT and the low-voltage TFT are formed on one and the same substrate. In particular, the thin film semiconductor device according to the present invention can be preferably applied to an image display device. FIG. 20 is a plan view showing an active matrix substrate of a liquid crystal display device which is fabricated by using the TFTs according to the present invention. In the active matrix substrate 20, a drawer unit 22 is provided along one side of a glass substrate 21, and an image display unit 25 is provided at the center of the glass substrate 21. Moreover, a data driver 23 and a gate driver 24 are provided along the periphery of the image display unit 25. Each of the data driver 23 and the gate driver 24 has the low-voltage TFT and the high-voltage TFT in which a polysilicon film is used as an active layer. The threshold voltages of these transistors are adjusted in accordance with the present invention. Moreover, TFTs using an amorphous silicon film or a polysilicon film are arranged in a matrix form in the image display unit 25.

Although the image display unit 25 and the drivers 23 and 24 are formed on one and the same substrate according to the liquid crystal display apparatus shown in FIG. 20, the data driver 23 and the gate driver 24 may be formed on a substrate different from the substrate for the image display unit 25. The substrate on which the data driver 23 and the gate driver 24 are formed may be fixed on the substrate on which the image display unit 25 is formed (a so-called glass-on-glass structure).

It will be obvious to one skilled in the art that the present invention may be practiced in other embodiments that depart from the above-described specific details. The scope of the present invention, therefore, should be determined by the following claims.

What is claimed is:

1. A thin film semiconductor device comprising:
an insulating substrate;
a low-voltage thin film transistor formed on said insulating substrate and having a first semiconductor film, a first gate electrode and a first gate insulating film, wherein said first semiconductor film is formed on said first semiconductor film through said first gate insulating film; and
a high-voltage thin film transistor formed on said insulating substrate and having a second semiconductor film, a second gate electrode and a second gate insulating film,
wherein said second semiconductor film is formed on said insulating substrate and said second gate electrode is formed on said second semiconductor film through said second gate insulating film,
wherein said second gate insulating film comprises a combination of said first gate insulating film and at least another gate insulating film formed on said first gate insulating film, and said another gate insulating film is formed to cover said first gate electrode, and
wherein when p-type dopant concentration is represented by positive values and n-type dopant concentration is represented by negative values, an impurity doping state with respect to a channel region of said high-voltage thin film transistor is adjusted to be in more negative side as compared with an impurity doping state with respect to a channel region of said low-voltage thin film transistor of the same conductivity type.

2. The thin film semiconductor device according to claim 1, wherein a work function of material of said second gate electrode is lower than a work function of material of said first gate electrode.

3. The thin film semiconductor device according to claim 1, wherein each of said low-voltage thin film transistor and said high-voltage thin film transistor includes a p-channel thin film transistor.

4. The thin film semiconductor device according to claim 1, wherein each of said first semiconductor film and said second semiconductor film is a polysilicon thin film.

5. The thin film semiconductor device according to claim 1, wherein said p-type dopant concentration in said channel region of said high-voltage thin film transistor is lower than said p-type dopant concentration in said channel region of said low-voltage thin film transistor.

6. The thin film semiconductor device according to claim 1, wherein said n-type dopant concentration in said channel region of said high-voltage thin film transistor is higher than said n-type dopant concentration in said channel region of said low-voltage thin film transistor.

7. The thin film semiconductor device according to claim 2, wherein said p-type dopant concentration in said channel region of said high-voltage thin film transistor is lower than said p-type dopant concentration in said channel region of said low-voltage thin film transistor.

8. The thin film semiconductor device according to claim 2, wherein said n-type dopant concentration in said channel region of said high-voltage thin film transistor is higher than said n-type dopant concentration in said channel region of said low-voltage thin film transistor.

9. The thin film semiconductor device according to claim 1, wherein said channel region of said low-voltage thin film transistor is doped with p-type dopant, and said channel region of said high-voltage thin film transistor is doped with both of p-type dopant and n-type dopant.

10. The thin film semiconductor device according to claim 2, wherein said channel region of said low-voltage thin film transistor is doped with p-type dopant, and said channel region of said high-voltage thin film transistor is doped with both of p-type dopant and n-type dopant.

11. The thin film semiconductor device according to claim 1, wherein said high-voltage thin film transistor includes an n-channel thin film transistor having an LDD (Lightly Doped Drain) structure.

12. The thin film semiconductor device according to claim 1, wherein said low-voltage thin film transistor and said high-voltage thin film transistor are included in a gate driver and a data driver of an image display device.

13. The thin film semiconductor device according to claim 1, wherein n-type dopant concentration is enhanced in a thin semiconductor film except for under said first gate electrode of said low-voltage thin film transistor.

* * * * *